(12) United States Patent
Carnevali

(10) Patent No.: US 7,551,458 B2
(45) Date of Patent: Jun. 23, 2009

(54) SECURE UNIVERSAL MOUNTING APPARATUS

(76) Inventor: Jeffrey D. Carnevali, 5957 Beach Dr. SW., Seattle, WA (US) 98136

( * ) Notice: Subject to any disclaimer, the term of this patent is extended or adjusted under 35 U.S.C. 154(b) by 557 days.

(21) Appl. No.: 11/136,797

(22) Filed: May 24, 2005

(65) Prior Publication Data
US 2006/0285306 A1 Dec. 21, 2006

(51) Int. Cl.
H05K 7/02 (2006.01)

(52) U.S. Cl. .................... 361/807; 174/520

(58) Field of Classification Search ............... 361/807; 174/520
See application file for complete search history.

(56) References Cited

U.S. PATENT DOCUMENTS

| | | |
|---|---|---|
| 1,670,970 A | 5/1928 | Leverdiere |
| 1,684,925 A | 9/1928 | Perlmutter |
| 2,319,377 A | 5/1943 | Wallace et al. |
| 2,653,330 A | 9/1953 | Nolan |
| 2,733,492 A | 2/1956 | Copell |
| 3,509,882 A | 5/1970 | Blake |
| 3,581,424 A | 6/1971 | Bloom |
| 3,669,392 A | 6/1972 | Saunders |
| 4,066,231 A | 1/1978 | Bahner et al. |
| 4,118,003 A | 10/1978 | Dillow |
| 4,798,294 A | 1/1989 | Bodi |
| 4,802,708 A | 2/1989 | Vos et al. |
| 4,803,759 A | 2/1989 | Kemble |
| 4,844,387 A | 7/1989 | Sorgi et al. |
| 4,909,159 A | 3/1990 | Gonsoulin |
| 4,928,916 A | 5/1990 | Molloy |
| 4,957,264 A | 9/1990 | Hakanen |
| 4,976,721 A | 12/1990 | Blasnik et al. |
| 5,024,408 A | 6/1991 | Magee |
| 5,149,032 A | 9/1992 | Jones et al. |
| 5,457,745 A | 10/1995 | Wang |
| 5,582,377 A | 12/1996 | Quesada |
| D377,798 S | 2/1997 | Heine |
| 5,612,509 A | 3/1997 | Market |
| 5,653,414 A | 8/1997 | Chimel |
| 5,673,628 A | 10/1997 | Boos |
| D390,849 S | 2/1998 | Richter et al. |
| 5,788,202 A | 8/1998 | Richter |
| 5,793,614 A | 8/1998 | Toolbom |
| 5,845,885 A | 12/1998 | Carnevali |
| 5,903,645 A | 5/1999 | Tsay |
| 5,917,907 A | 6/1999 | Kela |
| 6,032,337 A | 3/2000 | Rankin et al. |
| 6,076,790 A | 6/2000 | Richter |
| 6,095,470 A | 8/2000 | Kalis |

(Continued)

Primary Examiner—Dean A. Reichard
Assistant Examiner—Yuriy Semenenko
(74) Attorney, Agent, or Firm—Charles J. Rupnick

(57) ABSTRACT

A universal mounting apparatus formed of a device cradle that is configured with a base plate having a device mounting surface with an integral stop structure adjacent to a first end thereof and projected thereabove, and a linear drive channel arranged along a first axis thereof. The universal mounting apparatus including a clamping mechanism having a linear drive shaft structured to slidingly engage the linear drive channel with a movable clamp structure projected above the device mounting surface adjacent to a second end of the base plate, the movable clamp structure has clamping surfaces inclined toward the device mounting surface and the integral stop structure projected thereabove. A spring is coupled for biasing the movable clamp structure toward the integral stop structure along the first axis.

18 Claims, 12 Drawing Sheets

U.S. PATENT DOCUMENTS

| | | | |
|---|---|---|---|
| 6,173,933 B1 | 1/2001 | Whiteside et al. | |
| 6,213,438 B1 | 4/2001 | Ostby et al. | |
| 6,229,893 B1 | 5/2001 | Chen | |
| 6,260,866 B1 | 7/2001 | Cheng | |
| 6,286,797 B1 | 9/2001 | Thaxton | |
| 6,370,741 B1 * | 4/2002 | Lu | 24/523 |
| 6,427,959 B1 | 8/2002 | Kalis et al. | |
| 6,585,212 B2 | 7/2003 | Carnevali | |
| 6,600,827 B2 | 7/2003 | Lu | |
| 6,647,248 B1 | 11/2003 | Ortscheid et al. | |
| 6,785,567 B2 * | 8/2004 | Kato | 455/575.9 |
| 6,802,248 B1 | 10/2004 | Chiang | |
| 6,814,377 B2 | 11/2004 | Silverman et al. | |
| 6,817,587 B2 | 11/2004 | Lin | |
| 6,846,196 B1 * | 1/2005 | Fallon | 439/369 |
| 7,002,808 B2 * | 2/2006 | Lim et al. | 361/752 |
| 7,017,243 B2 * | 3/2006 | Carnevali | 24/523 |
| 7,032,872 B2 | 4/2006 | Sullivan | |
| 7,066,752 B2 * | 6/2006 | Hsu et al. | 439/248 |
| 2004/0022388 A1 | 2/2004 | Chan et al. | |
| 2006/0026807 A1 | 2/2006 | Carnevali | |
| 2006/0061980 A1 * | 3/2006 | Shimizu | 361/807 |
| 2007/0022582 A1 | 2/2007 | Carnevali | |
| 2007/0022583 A1 | 2/2007 | Carnevali | |
| 2007/0139873 A1 * | 6/2007 | Thomas et al. | 361/681 |

* cited by examiner

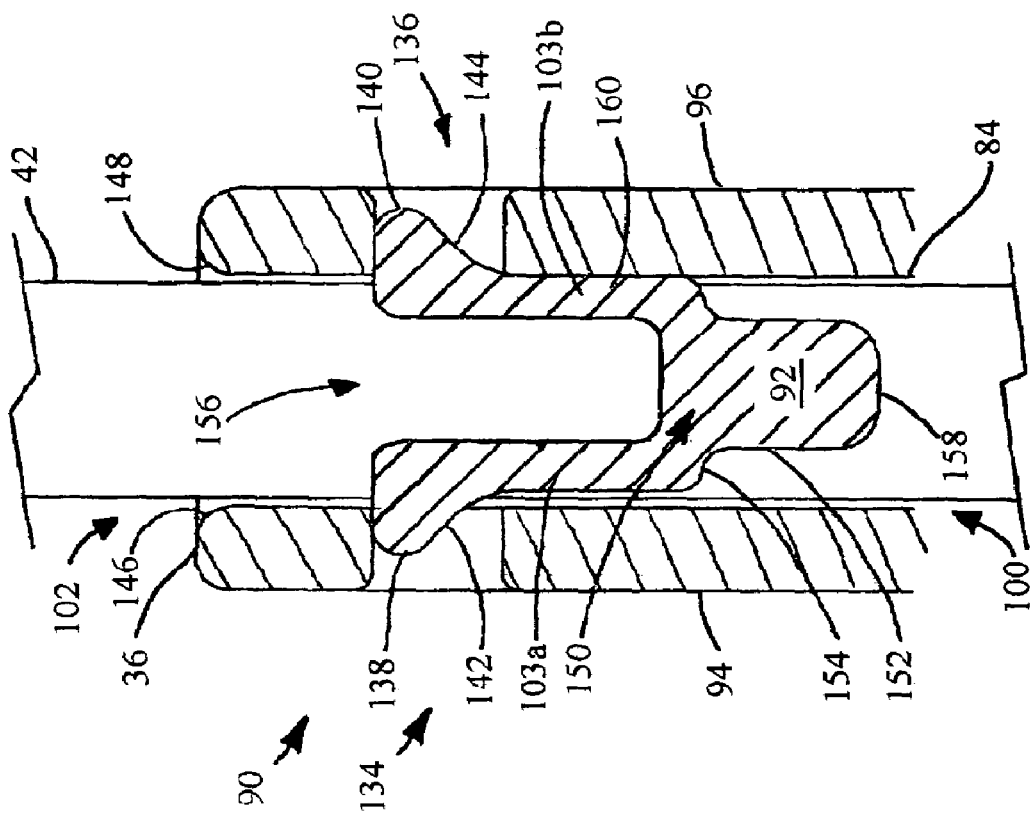
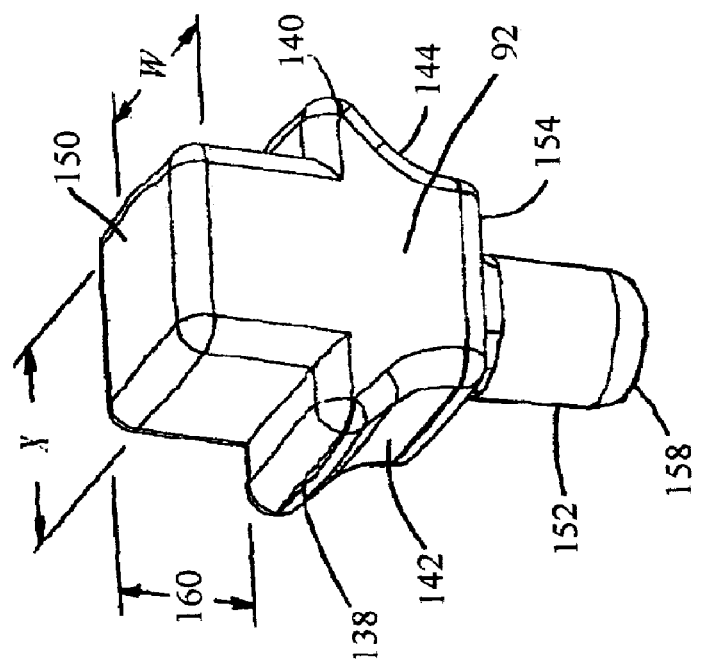
Fig. 9
Fig. 8

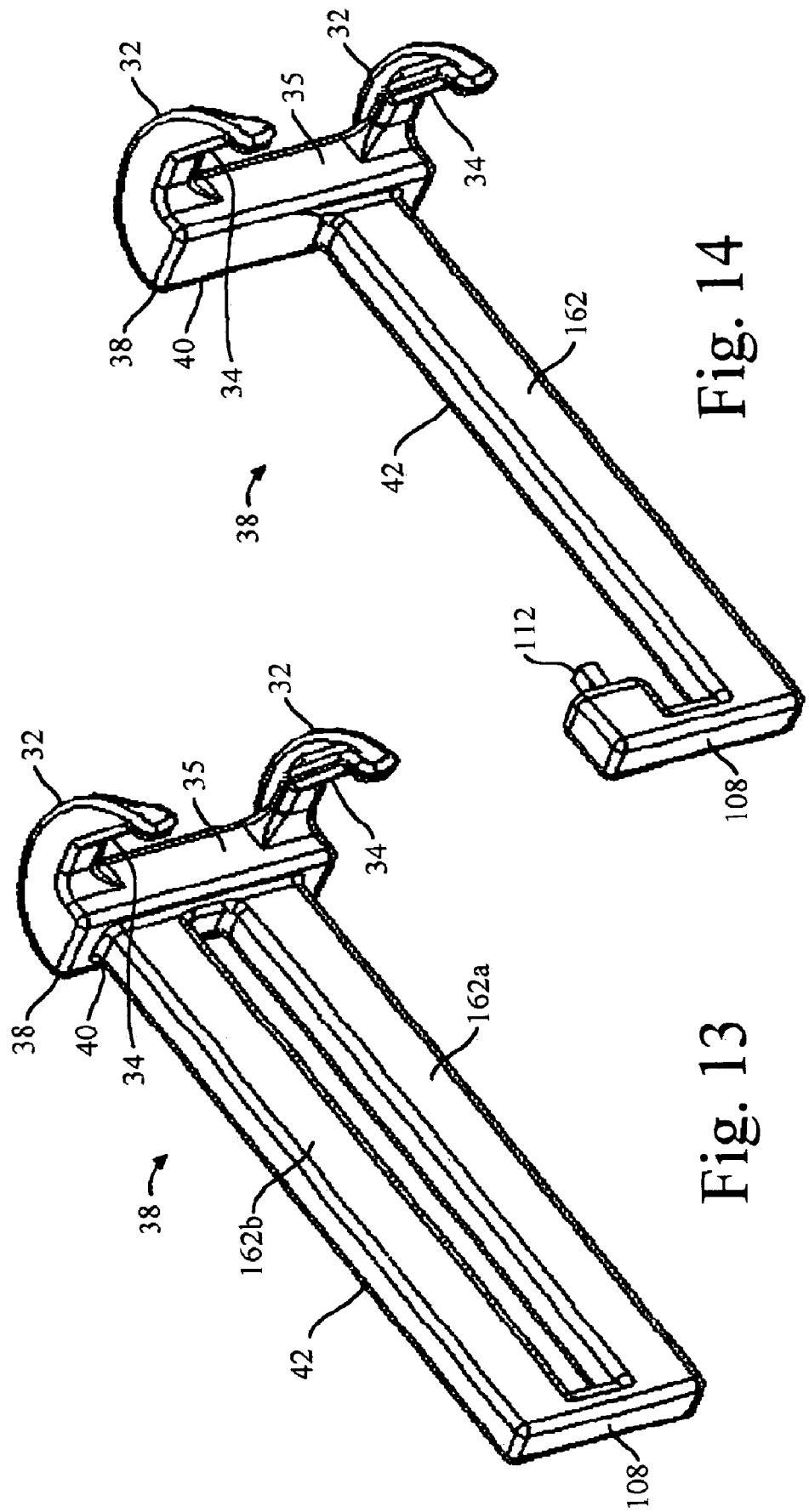

SECURE UNIVERSAL MOUNTING APPARATUS

RELATED APPLICATIONS

The present application is related to and claims benefit of co-pending U.S. patent application Ser. No. 10/636,058 filed in the name of the inventor of the present application on Aug. 7, 2003, the complete disclosure of which is incorporated herein by reference.

FIELD OF THE INVENTION

The present invention relates to a mounting apparatus for an electronic device, and in particular to mounting apparatuses for securely releasably cradling and optionally electrically interfacing a pocket-sized personal computer and other mobile electronic devices.

BACKGROUND OF THE INVENTION

Mounting platforms are generally well-known for securely cradling and electrically interfacing hand-held pocket-sized personal computers, commonly referred to as "pocket PCs," and other mobile electronic devices, such as cellular telephones, mobile global positioning system (GPS) receivers, Personal Digital Accessories (PDAs), handle-held personal computers and other mobile electronic devices of the type generally illustrated in FIG. 1.

One such mounting platform is presented in U.S. Pat. No. 6,427,959, entitled MOUNTING BRACKET FOR AN ELECTRONIC DEVICE, issued Aug. 6, 2002, to Kalis, et al., which is incorporated herein by reference, which includes a cradle adapted for being releasably secured to the electronic device and also includes a support adapted for being mounted to a surface. The cradle is adapted to move along its longitudinal axis relative to an electrical connector that is slidably connected to the cradle. A user can fix the position of the cradle relative to the mounting surface by means of a pin and locking mechanism on the back of the cradle to the support.

Other mounting platforms are also currently known. However, current mounting platforms may be inefficient for effectively securely releasably cradling and electrically interfacing a pocket-sized personal computers or other mobile electronic devices.

SUMMARY OF THE INVENTION

The present invention is a universal mounting apparatus that overcomes known limitations of prior art apparatus for securing an array of different hand-held or personal mobile device such as a pocket-sized personal computer, commonly referred to as a "pocket PC," and other personal mobile electronic devices, such as cellular telephones, mobile global positioning system (GPS) receivers, a Personal Digital Accessory (PDA) and other hand-held or personal mobile devices.

The spring-loaded clamping mechanism permits such a pocket PC or other hand-held or mobile device to be easily and securely mounted in powered or unpowered cradle, while permitting quick and easy removal of the device.

According to one aspect of the invention, the universal mounting apparatus of the present invention is formed of a substantially rigid device cradle configured with a base plate having a substantially planar device mounting surface with an integral stop structure adjacent to a first end thereof and projected thereabove, and an integral linear drive channel arranged along a first axis thereof. The universal mounting apparatus of the present invention includes a clamping mechanism having a substantially rigid linear drive shaft structured to slidingly engage the linear drive channel of the rigid cradle with a movable clamp structure projected above the device mounting surface of the base plate adjacent to a second end thereof, the movable clamp structure has one or more clamping surfaces angularly inclined toward the device mounting surface of the base plate and toward the integral stop structure projected thereabove. A spring is coupled for biasing the movable clamp structure toward the integral stop structure of the base plate along the first axis thereof; and a plurality of substantially upright posts are coupled to the base plate and spaced apart on opposite sides of the first axis thereof between the first and second end thereof.

According to another aspect of the invention, one or more of the plurality of upright posts is further adjustable relative to the first axis of the base plate.

According to another aspect of the invention, one or more of the plurality of upright posts is further repositionable along the first axis of the base plate.

According to another aspect of the invention, one or more of the angularly inclined clamping surfaces form an angle in the range of 45 degrees to 75 degrees with the device mounting surface of the base plate.

According to another aspect of the invention, the integral stop structure is further formed with one or more clamping surfaces angularly inclined toward the device mounting surface of the base plate and toward the second end of the base plate.

According to another aspect of the invention, the device cradle is further formed with an integral housing structure having the integral stop structure formed adjacent to the first end of the device mounting surface and projected thereabove, the housing structure including a ceiling surface spaced away from the device mounting surface of the base plate. The apparatus of the invention further including a printed wiring board having an electrical input/output interface connector mounted thereon; and an adjustable height spacer structure arranged for securing the printed wiring board within the housing structure in an adjustable offset position relative to the ceiling surface thereof with the electrical input/output interface connector substantially aligned along the first axis of the base plate and projected toward the second end of the base plate.

Other aspects of the invention are detailed herein.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 8 illustrates one exemplary embodiment of a locking key of the present invention for use in combination with the locking mechanism of the present invention;

FIG. 9-12 illustrate different alternative embodiments of the locking mechanism of the present invention each having an alternative embodiment of the locking key of the present invention;

FIG. 13 illustrates one exemplary embodiment of a movable clamp portion of the spring-loaded clamping mechanism of the invention;

FIG. 14 illustrates one alternative embodiment of the movable clamp portion of the spring-loaded clamping mechanism of the invention;

DETAILED DESCRIPTION OF PREFERRED EMBODIMENT

In the Figures, like numerals indicate like elements.

The universal mounting apparatus of the present invention is embodied by example and without limitation as a spring-loaded clamping mechanism arranged relative to a cradle for securely releasably cradling and optionally electrically interfacing a pocket-sized personal computer and other mobile electronic devices. The cradle is formed of a base plate having a fixed stop structure arranged along a first axis of the base plate adjacent to a first end thereof and projected above a device mounting surface thereof, the stop structure includes clearance therethrough that is substantially aligned with the first axis of the base plate.

The spring-loaded clamping mechanism includes a jaw that is arranged for elastic motion substantially along the first axis of the base plate. The jaw includes a clamping surface that is projected above the base plate and inclined toward the device mounting surface. The jaw is elastically biased toward the fixed stop structure and a second end of the base plate opposite from the fixed stop structure. The spring-loaded clamping mechanism includes a movable clamp having the jaw portion coupled adjacent to one end of a substantially rigid drive shaft. The spring-loaded clamping mechanism of the invention is integrated with the base plate in an expandably contracting assembly. By example and without limitation, the drive shaft is structured to move within a drive channel that is structured along the first axis of the base plate, for example, on a back side thereof opposite from the device mounting surface. By example and without limitation, a compression spring is constrained within the drive channel between a foot portion of the drive shaft distal from the jaw and a locking key that is coupled within the drive channel adjacent to the second edge of the base plate.

Multiple fence posts are spaced apart across the device mounting surface along the first axis between the first and second ends of the base plate, one or more of the fence posts being adjustable a relative to a second axis of the base plate that is substantially crosswise to the first axis.

Figure 1:
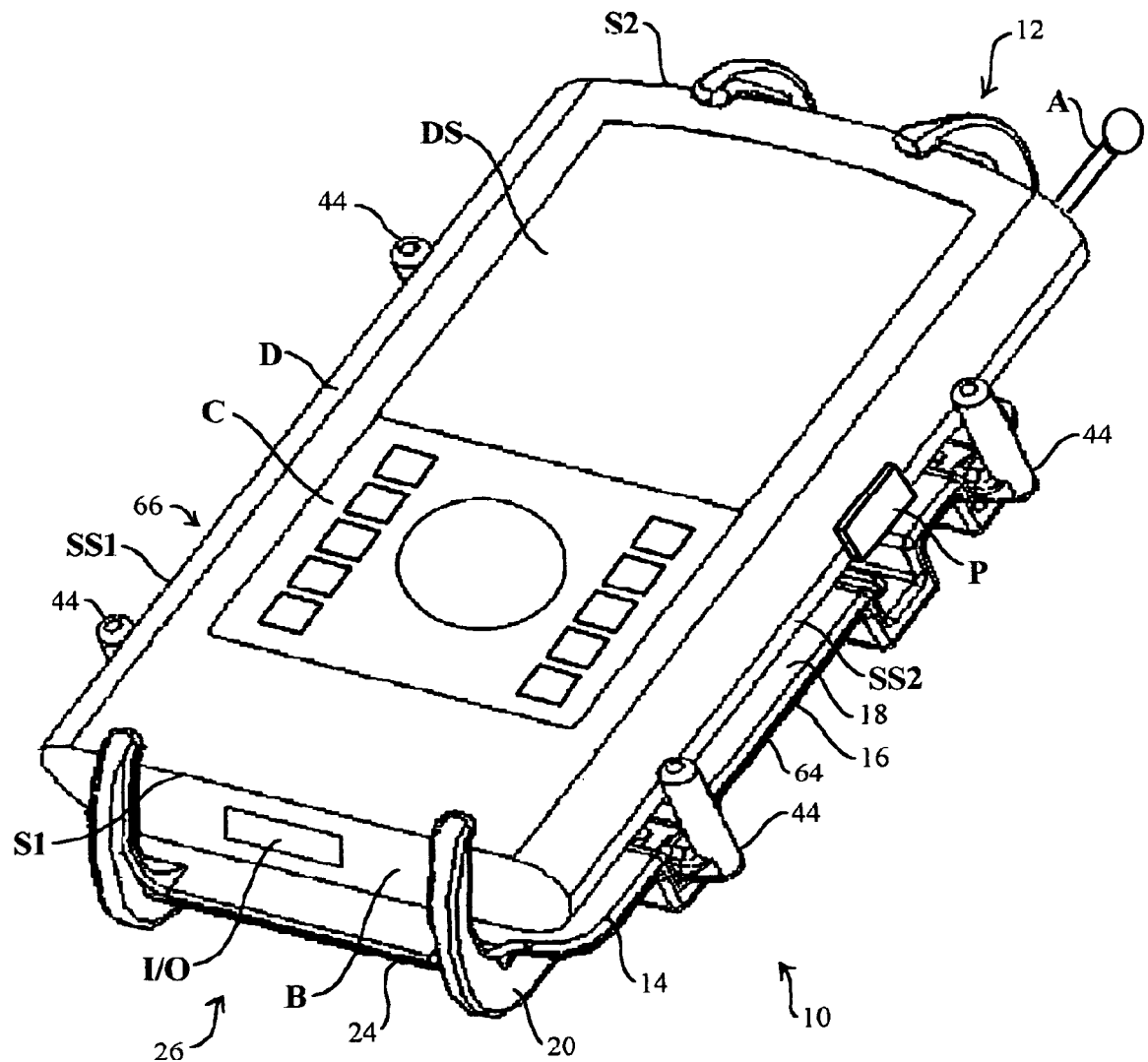
FIG. 1 illustrates the present invention embodied as a releasably-clamped universal mounting apparatus for securely receiving an external mobile electronic device a well-known type.

FIG. 1 is a perspective view that illustrates the apparatus of the present invention embodied as a releasably clamped cradling apparatus 10 that is structured for securely receiving and optionally electrically interfacing one of the generally well-known pocket-sized mobile electronic devices D of a type generically illustrated here, such as a hand-held pocket-sized personal computer, commonly referred to as a "pocket PC," or another mobile electronic device, such as a cellular telephone, a mobile global positioning system (GPS) receiver, a Personal Digital Accessory (PDA) or another mobile electronic device such as are generally well-known.

The apparatus 10 is structured with a spring-loaded clamping mechanism 12 arranged relative to a cradle 14 that is structured for securely releasably cradling and optionally electrically interfacing the pocket-sized personal computer or other mobile electronic device D. The cradle 14 is formed of a base plate 16 having a substantially planar device mounting surface 18 that is structured for receiving the body of the device D. The spring-loaded clamping mechanism 12 is integrated with the cradle 14 in an expandably contractible assembly with the base plate 16 for securing the device D in the cradle 14 against the device mounting surface 18 of the base plate 16.

As is generally well-known, pocket PCs and other mobile electronic devices D of the type illustrated here, which are intended to be supported by the apparatus 10 of the invention, typically include operational controls C and an information viewing or display screen DS, both located on one face. Aspects of the apparatus 10 of the invention are therefore structured to expose the facial operational controls C and display screen DS to the user. For example, according to the embodiment illustrated herein, a stop structure 20 arranged adjacent to a first end 24 of the base plate 16. The stop structure 20 is projected above the device mounting surface 18 of the base plate 16 for positively engaging base shoulder portions S1 of a device D inserted on the device mounting surface 18. The stop structure 20 includes an access passage 26 therethrough that is substantially aligned with the first axis 22 of the base plate 16. The clearance passage 26 provides access to an electrical interface input/output I/O port of the inserted device D, typically located central of a base surface B, that accepts a complementary external electrical interface input/output (I/O) cable.

The spring-loaded clamping mechanism 12 drives against superior shoulder portions S2 of the inserted device D opposite from the base shoulder portions S1 for releasably clamping the inserted device D within the cradle 14. Additionally, the spring-loaded clamping mechanism 12 is structured to occlude a minimum area of the superior shoulder portions S2 for avoiding potential interferences with control surfaces of the inserted device D, for example, an antenna A.

Multiple substantially upright fence posts 44 are spaced apart across the device mounting surface 18 of the base plate 16. Spacing between one or more of the fence posts 44 on opposite sides 64, 66 of the base plate's device mounting surface 18 are adjustable for accommodating inserted devices D of different widths. Additionally, one or more of the fence posts 44 are repositionable along the sides 64, 66 of the base plate 16 for avoiding potential interferences with control surfaces of the inserted device D, for example, a power switch P.

In operation, the device D is loaded into the apparatus 10 of the invention by first retracting the spring-loaded clamping mechanism 12 relative to the base plate 16. When the clamping mechanism 12 is sufficiently expanded relative to the base plate 16, the device D is seated against the device mounting surface 18 of the base plate 16 with the base shoulder portions S1 bottomed against the stop structure 20. The device D is electrically interfaced by means of mating an electrical input/output I/O interface in the bottom of the device D with a complementary electrical connector mounted through the access passage 26. The clamping mechanism 12 is thereafter permitted to engage the superior shoulder portions S2 of the inserted device D by contained spring pressure. The spring-loaded clamping mechanism 12 thereby securely releasably cradles the device D against the cradle 14.

Figures 2, 3:
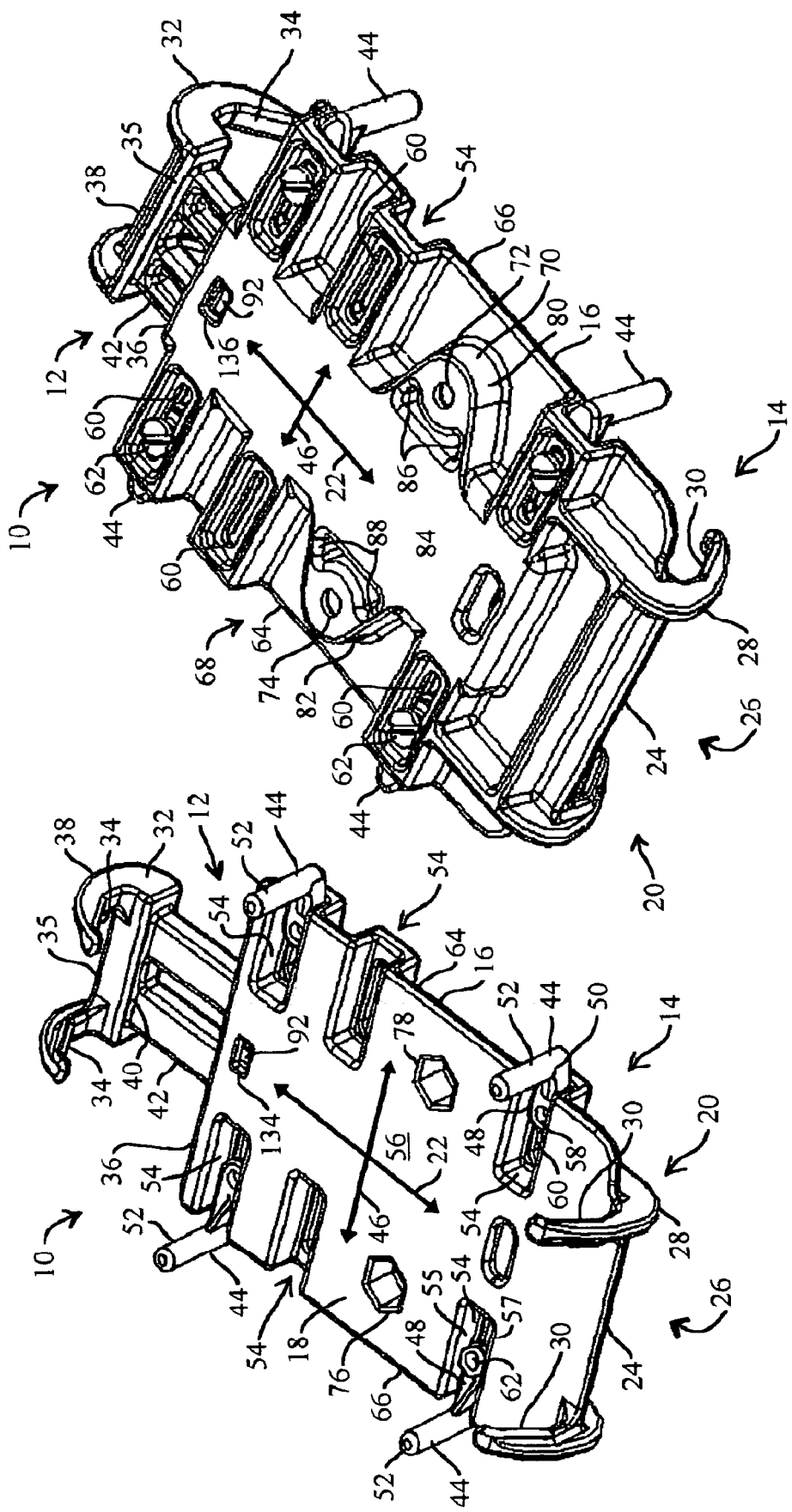
FIG. 2 illustrates the releasably-clamped universal mounting apparatus of the present invention.
FIG. 3 illustrates a back side of the releasably-clamped universal mounting apparatus of the present invention.

FIG. 2 is a perspective view that illustrates the apparatus of the present invention embodied as the releasably clamped cradling apparatus 10 that is structured for securely receiving and optionally electrically interfacing one of the generally well-known pocket-sized mobile electronic devices D of the type generically illustrated in FIG. 1, such as a hand-held pocket-sized personal computer, commonly referred to as a "pocket PC," or another mobile electronic device, such as a cellular telephone, a mobile global positioning system (GPS) receiver, a Personal Digital Accessory (PDA) or another mobile electronic device such as are generally well-known.

The apparatus 10 is structured with the spring-loaded clamping mechanism 12 arranged relative to the cradle 14 for securely releasably cradling and optionally electrically interfacing a pocket-sized personal computer and other mobile electronic devices. The cradle 14 is formed of the base plate 16 that is structured with the substantially planar device mounting surface 18 having the stop structure 20 arranged along a first axis 22 of the base plate 16 and projected above the device mounting surface 18. The stop structure 20 is fixed substantially stationary relative to the base plate 16 and arranged adjacent to the first end 24 thereof. The stop structure 20 includes the clearance passage 26 therethrough that is substantially aligned with the first axis 22 of the base plate 16.

According to one embodiment of the present invention, the stop structure 20 includes a first substantially rigid jaw structure 28. The first jaw structure 28 includes one or more substantially planar clamping surfaces 30 that are projected above the base plate 16 and inclined toward the device mounting surface 18. The first jaw structure 28 is fixed in a substantially stationary arrangement adjacent to the first end 24 of the base plate 16 and is optionally formed integrally therewith, as by injection molding of the base plate 16 of a substantially rigid metal, plastic or composite material. According to one embodiment of the present invention, the first jaw structure 28 includes two of the clamping surfaces 30 spaced apart across the first axis 22 of base plate 16. The clearance passage 26 through the stop structure 20 is formed between the spaced-apart clamping surfaces 30 that are projected above the device mounting surface 18.

The spring-loaded clamping mechanism 12 includes a movable clamp structure 38 arranged for elastic motion substantially along the first axis 22 of the base plate 16. By example and without limitation, the movable clamp structure 38 includes a substantially rigid bar 35 coupled adjacent to a head end 40 of a substantially rigid drive shaft 42. A second substantially rigid jaw structure 32 is formed on the rigid bar 35 and includes one or more substantially planar clamping surfaces 34 that are projected above the base plate 16 and inclined toward the device mounting surface 18. According to one embodiment of the invention, the jaw structure 32 is configured such that two of the clamping surfaces 34 are spaced apart across the first axis 22 of the base plate 16. The movable clamp structure 38 is elastically biased for travel along the first axis 22 of the base plate 16 toward a second end 36 thereof opposite from the stop structure 20, whereby the jaw structure 32 and the one or more clamping surfaces 34 are elastically biased toward the relatively stationary clamping surfaces 30 of the stop structure 20.

Multiple substantially upright fence posts 44 are spaced apart across the device mounting surface 18 along the first axis 22 between the first and second ends 24, 36 of the base plate 16. One or more of the fence posts 44 are adjustable a relative to a second axis 46 of the base plate 16 that is substantially crosswise to the first axis 22. By example and without limitation, each adjustable fence post 44 includes a foot structure 48 adjacent to one end 50 of a substantially upright post 52. The foot 48 is structured to be moved within a slot or relief 54 formed in or of the base plate 16. For example, the foot 48 is slidable along the relief 54 for moving the upright post 52 toward or away from a central portion 56 of the base plate's device mounting surface 18 corresponding to the first axis 22 of the base plate 16. Each adjustable fence post 44 is substantially permanently securely positioned relative to the central portion 56 of the device mounting surface 18 by securing the foot structure 48 relative to the base plate 16. By example and without limitation, the foot structure 48 of each adjustable fence post 44 includes a clearance hole 58 therethrough corresponding to a slot 60 formed through the base plate 16 lengthwise in the relief 54. A threaded or other fastener 62 (one shown) secured through the clearance hole 58 and corresponding slot 60 effectively secures the foot structure 48 relative to the relief 54, whereby the upright post 52 of the adjustable fence post 44 is adjustably secured relative to the device mounting surface 18 of the base plate 16.

According to one embodiment of the invention, additional reliefs 54 for the fence posts 44 are spaced along the sides 64, 66 of the base plate 16. The fence posts 44 are repositionable along the sides 64, 66 of the base plate 16 by being moved to different reliefs 54.

According to one embodiment of the invention, the reliefs 54 are formed with substantially parallel spaced-apart wall surfaces 55, 57 that optionally operate to constrain the fastener 62 from turning when it is a square or hex nut used in combination with a screw, as illustrated.

In practice, the user inserts the device D into the cradle 14 substantially aligned with the base plate 16 and adjusts the fence posts 44 to positions snuggly engaged against opposing side surfaces SS1, SS2 of the inserted device D, as illustrated in FIG. 1. The fasteners 62 are engaged and tightened to permanently position the posts 44 in the adjusted positions. Thereafter, the device D has sufficient clearance between the posts 44 for easy insertion and removal from the apparatus 10 of the invention.

FIG. 3 is a perspective view that illustrates a back side 68 the releasably clamped cradling apparatus 10 opposite from the device mounting surface 18 wherein the stop structure 20 is integrally formed with the base plate 16. The apparatus 10 is either permanently or semi-permanently installable as a vehicle support platform and removably attachable as by a belt to the user's person as a personal carrying apparatus. For example, the apparatus 10 includes an integral support interface or mechanical connector structure 70 for mounting to an external support structure, such as the ball-and-socket support structure disclosed in U.S. Pat. No. 5,845,885, UNIVERSALLY POSITIONABLE MOUNTING DEVICE, issued to the inventor of the present invention on Dec. 8, 1998, which is incorporated in its entirety herein by reference. The mechanical connector 70 is operated, for example, by fasteners (not shown) passed through a pair of spaced-apart fastener clearance holes 72, 74 through the base plate 16. The clearance holes 72, 74 may provided with counter-bores 76, 78 (shown in FIG. 2) to accept the fasteners. When the fasteners are configured with square or hex-shaped heads, the clearance holes 72, 74 may be counter-bored with a matching square or hex shape for securing the fasteners against rotation while mating nuts (not shown) are installed to secure the apparatus 10 to the support structure.

The pair of spaced-apart fastener clearance holes 72, 74 are structured for coupling the apparatus 10 to a belt clip, a ball-and-socket mounting device, or another support structure. While illustrated by example as one pair of spaced-apart fastener clearance holes 72, 74, the mechanical connector structure 70 is not to limited the exemplary embodiment depicted. Rather, the mechanical connector structure 70 optionally has more or less of the fastener clearance holes 72, 74. The fastener clearance holes 72, 74 are optionally threaded for a threaded fastener, or are constructed with a smooth bore as clearance holes for threaded or other fasteners. According to one embodiment of the invention, the mechanical connector structure 70 includes a pair of pedestals or bosses 80, 82 integrally formed on the exterior surface of the back portion 16 of the base plate 16 with the bosses 80, 82 containing the pair of spaced-apart fastener clearance holes 72, 74, respectively.

The bosses 80, 82 are optionally joined to the exterior of a spinal tube or closed-surface lengthwise drive channel 84 that forms a rigid spine along the back side 68 of base plate 16 and houses the drive shaft 42 of the movable clamp 38. For example, the bosses 80, 82 are joined to the spinal drive channel 84 by a first and second pairs of stiffeners 86, 88 of the connector structure 70 that project from the exterior surface of the upright tubular body 160 between the bosses 80, 82 containing the pair of spaced-apart fastener clearance holes 72, 74. The pairs of stiffeners 86, 88 are formed integrally with the exterior surfaces of both the back portion 16 of the base plate 16 and the spinal channel 84 as well as with the bosses 80, 82 containing the pair of spaced-apart fastener clearance holes 72, 74. The pairs of stiffeners 86, 88 are optionally structured in an diamond pattern (shown) or other shape desirable for conforming to a mounting interface of a belt clip, a ball-and-socket mounting device, or another support of choice.

Figure 4:
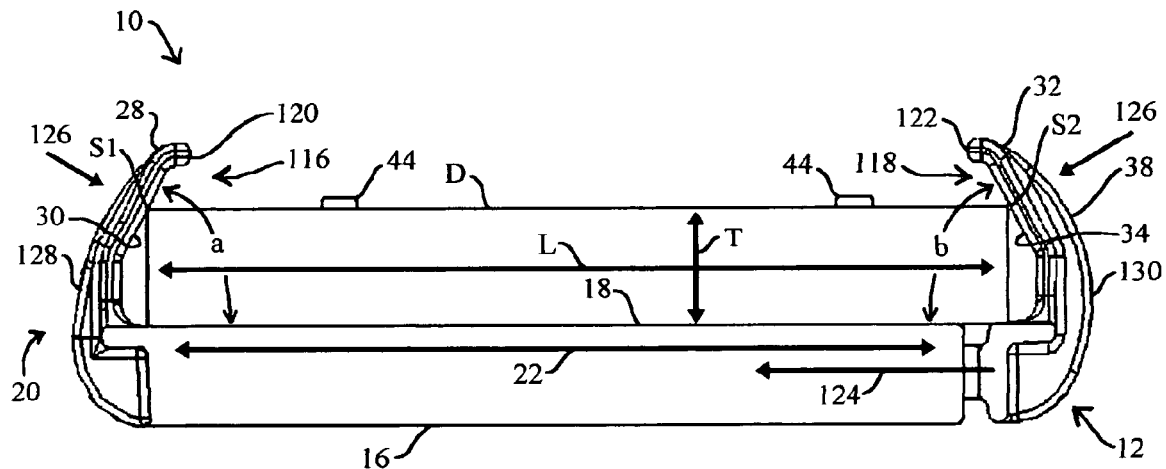
FIGS. 4 and 5 illustrate one embodiment of the releasably-clamped universal mounting apparatus of the present invention for accommodating external mobile electronic devices of different length and thickness dimensions.
Figure 5:
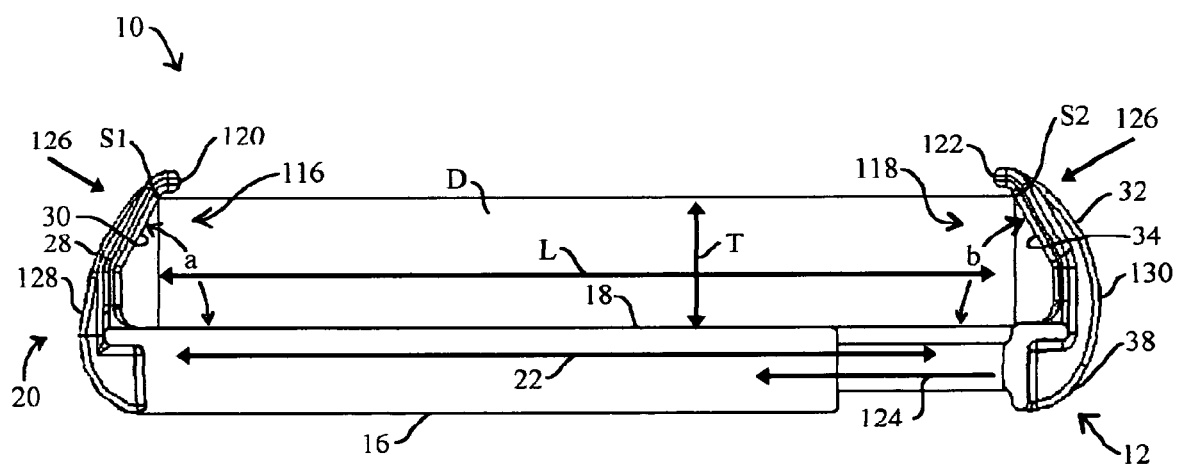

FIGS. 4 and 5 are views of the apparatus 10 that illustrate one embodiment of the stop structure 20 and opposing spring-loaded clamping mechanism 12 for accommodating devices D of different dimensions. The spring-loaded clamping mechanism 12 is expandably contractible relative to the base plate 16 so as to expand to accept devices D of a length L at its maximum, and also to contract to contain devices D of length L at its minimum, where the minimum and maximum lengths L are typical for devices D of the type described herein currently available in the market. By example and without limitation, the apparatus 10 is illustrated in FIG. 4 having the spring-loaded clamping mechanism 12 substantially contracted for accommodating devices D of minimum length L.

By example and without limitation, FIG. 5 illustrates the apparatus 10 having the spring-loaded clamping mechanism 12 substantially expanded for accommodating devices D of maximum length L.

FIGS. 4 and 5 also illustrate the jaw structure 28 of the relatively stationary stop structure 20, including one of the one or more clamping surfaces 30 that are projected above the base plate 16 and inclined toward the device mounting surface 18. Also illustrated here is the jaw structure 32 of the spring-loaded clamping mechanism 12, including one of the one or more clamping surfaces 34 that are also projected above the base plate 16 and inclined toward the device mounting surface 18. The stationary and movable jaw structures 28, 32 are structured for accommodating devices D of different thickness dimensions T.

According to one embodiment of the invention, the apparatus 10 is illustrated here having the respective clamping surfaces 30, 34 projected above the device mounting surface 18 of the base plate 16 for accommodating devices D of thicknesses T between a minimum and a maximum, where the minimum and maximum thicknesses T are typical for devices D of the type described herein currently available in the market. By example and without limitation, the stationary and movable jaw structures 28, 32 have respective openings 116, 118 that encompass the entire range of thicknesses T between the device mounting surface 18 of the base plate 16 and opposing lips 120, 122 of the respective jaw structures 28, 32.

According to one embodiment of the invention, the respective clamping surfaces 30, 34 reside within the respective openings 116, 118 between the device mounting surface 18 and the opposing lips 120, 122 of the respective jaw structures 28, 32. The respective openings 116, 118 face toward one another across the device mounting surface 18 of the base plate 16. The respective clamping surfaces 30, 34 project above the device mounting surface 18 and are inclined toward the device mounting surface 18, each forming a respective angles a, b with the device mounting surface 18. The angles a, b of the respective clamping surfaces 30, 34 are any angle between 0 and 90 degrees, inclusive. However, according to one embodiment of the invention, the angles a, b of the respective clamping surfaces 30, 34 are any angle in the range between about 45 degrees and about 75 degrees, inclusive. According to another embodiment of the invention, the angles a, b of the respective clamping surfaces 30, 34 are about 75 degrees, but according to other embodiments of the invention can optionally vary + or −15 degrees or more, from about 60 to 90 degrees.

According to one embodiment of the invention, the angles a of the clamping surfaces 30 are about the same as the angles b of the clamping surfaces 34. The angularly inclined clamping surfaces 30, 34 facing inwardly and downwardly toward the device mounting surface 18 permits the structures 28, 32 to engage the opposing base and superior shoulder portions S1, S2 on upper edges of the inserted device D anywhere along the entire length of the inclined clamping surfaces 30, 34 so that devices D having different thicknesses T are easily accommodated, without adjustments in the positions of the stop structure 20 and opposing spring-loaded clamping mechanism 12 relative to the device mounting surface 18.

As indicated by the arrow 124, the spring-loaded clamping mechanism 12 urges the elastically biased jaw structure 32 of the movable clamp 38 to approach the relatively stationary stop structure 20 along the first axis 22 of the base plate 16. Urging the elastically biased jaw structure 32 of the movable clamp 38 simultaneously urges the clamp members 26 to approach one another along the first axis 22 of the base plate 16 such that the angularly inclined clamping surfaces 30, 34 press on the opposing shoulder portions S1, S2 of the of the inserted device D to compress the inserted device D downwardly toward the device mounting surface 18, as indicated by the arrows 126.

Additionally, each jaw structures 28, 32 is optionally provided with a stiffener portion 128, 130 extending along part or all of its length for strengthening the respective jaw structures 28, 32 in the plane of the first axis 22 of the base plate 16 in which the inclined clamping surfaces 30, 34 act. The inserted device D is thereby captured between the inclined clamping surfaces 30, 34 and the device mounting surface 18 of the base plate 16.

Figure 6:
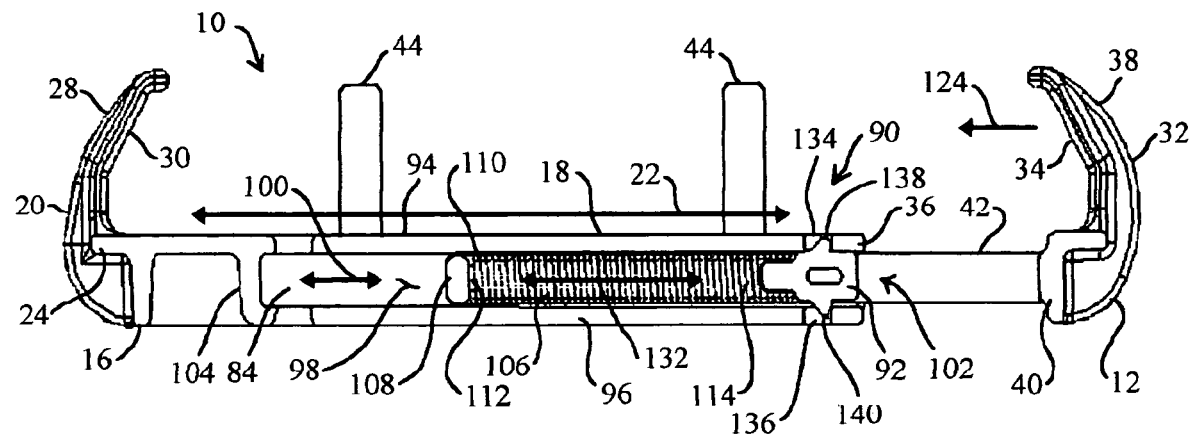
FIG. 6 illustrates one exemplary embodiment of a spring-loaded clamping mechanism of the invention in combination with the releasably-clamped universal mounting apparatus of the present invention.

FIG. 6 is a cross-sectional view of the apparatus 10 that illustrates one embodiment of the spring-loaded clamping mechanism 12 of the invention. For example, the assembly of the expandably contractible spring-loaded clamping mechanism 12, base plate 16 and a locking mechanism 90 of the invention are combined as the apparatus 10 the invention for securely cradling mobile electronic device D in releasable manner. The locking mechanism 90 of the invention is embodied as a locking key 92 combined with both the movable clamp 38 and base plate 16.

By example and without limitation, the drive shaft 42 is structured to move lengthwise within the closed-surface drive channel 84 that is structured along the first axis 22 of the base plate 16, for example, on the back side 68 thereof opposite from the device mounting surface 18. By example and without limitation, an elastically compressible biasing member or compression spring 106 is constrained within the drive channel 84 between a foot portion 108 of the drive shaft 42 distal from the jaw structure 32 and a locking key 92 that is coupled within the drive channel 84 adjacent to the second end 36 of the base plate 16.

As discussed above, by example and without limitation the drive channel 84 forms the spine of the base plate 16. As embodied in the illustrated example, the closed-surface of channel 84 is formed in part by an interior channel wall 94 that extends, by example and without limitation, substantially the entire length of the base plate 16. The interior channel wall 94 is matched by an opposing exterior channel wall 96 that is coupled to the interior wall 94 in a spaced-apart manner by a pair of spaced-apart opposing channel spacer walls 98 intervening therebetween. At least the interior wall 94, exterior wall 94, and intervening walls 98 that form the closed-surface of channel 84, and optionally the entire structure of the base plate 16, are integrally formed of a substantially rigid and resilient material, such as a rigid metal, plastic or composite material, such that the closed-surface of channel 84 operates as a stiffener to rigidify the base plate 16. The interior channel wall 94 is optionally laterally offset relative to the center of the base plate 16, which will be well-understood by those of ordinary skill in the mechanical arts to add further stiffening to the base plate 16.

The closed-surface channel 84 includes an lengthwise open space 100 between the closed surface formed by the interior, exterior, and intervening walls 94, 96, 98. The open space 100 extends from a first end 102 opposite from the stop structure 20 for substantially the entire length of the base plate 16 and thereby forms an open channel space within the interior of the closed-surface channel 84. The extended open space 100 is sized to admit the elongated rigid drive shaft 42 of the spring-loaded clamping mechanism 12 in sliding engagement for substantially the entire length of the closed-surface channel 84. Optionally, as embodied in the figures, the open space 100 extends substantially the entire length of the closed-surface channel 84 such that it is open at least on first end 102 of the open space 100 adjacent the second end 36 of the base plate 16, and optionally on a second opposite end 104 of the open space 100 adjacent to the first end 24 of the base plate 16, and the open space 100 has a substantially constant cross-sectional interior configuration for substantially its entire length. Although possibly more difficult to manufacture, the channel 84 is optionally closed at its second end 104 (as shown).

An elastically compressible biasing member or spring 106, illustrated by example and without limitation as a conventional coil-type steel compression spring, is inserted between the first near head end 40 of a drive shaft 42 adjacent to the jaw structure 32 and a foot portion 108 of the drive shaft 42 at a second end thereof distal from the jaw structure 32. The second distal foot end 108 of the elongated drive shaft 42 is structured to engage and restrain one end 110 of the biasing spring 106. For ease of assembly, the distal foot end 108 of the elongated drive shaft 42 optionally includes a tab or nib 112 structured to engage and restrain the end 110 of the biasing spring 106.

After this assembly with biasing spring 106, the elongated drive shaft 42 is inserted into the closed-surface channel 84. The second foot end 108 of the elongated drive shaft 42 is inserted through into the open space 100 via the channel's first open end 102 and slid toward the second opposite end 104 of the channel 84. The elongated drive shaft 42 is thereby slidingly engaged with the channel 84 formed between its interior, exterior, and intervening walls 94, 96, 98.

The biasing spring 106 is additionally compressed against the second distal foot end 108 of the movable clamp's elongated drive shaft 42 by pressure exerted against the biasing spring's free end 114. With the biasing spring 106 in a generally expanded condition having its free end 114 compressed against the distal foot end 108 of the elongated drive shaft 42 and captured within the closed-surface channel 84, the locking key 92 is installed between the free end 114 of the biasing spring 106 and the jaw structure 32 of the movable clamp 38, and is mechanically coupled to the channel 84 at its first open end 102 near the open space 100. The biasing spring 106 is thereafter expandably compressed between the locking key 92 and distal foot end 108 of the movable clamp's elongated drive shaft 42. The biasing spring 106 thereafter exerts an expanding spring force F, illustrated by the arrow 132, between the locking key 92 and the distal foot end 108 of the elongated drive shaft 42 that results in a force that contracts or biases the jaw structure 32 of the movable clamp 38 toward the stationary stop structure 20 of the cradle 14, as illustrated by the arrow 124. The biasing spring 106 thereby operates to expandably bias the movable clamp's jaw structure 30 toward the stationary stop structure 20 of the cradle 14 for securing an inserted device D therebetween. The biasing spring 106 is selected having a spring rate sufficient to cause the movable clamp 38 to securely cradle the inserted device D against the cradle's stationary stop structure 20.

Figure 7:
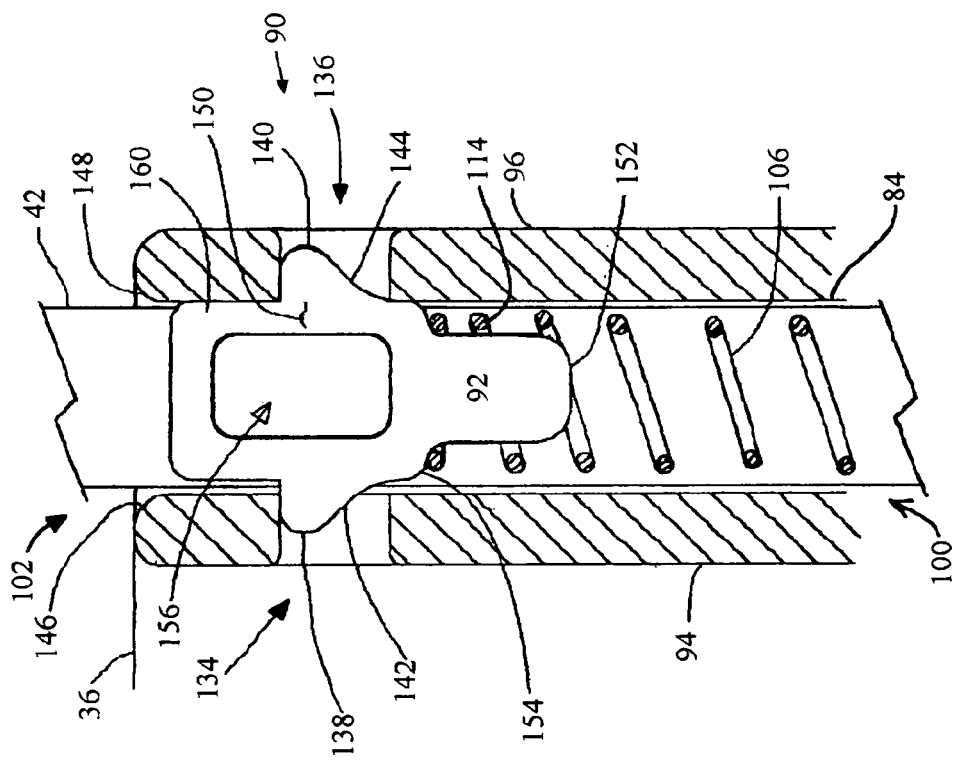
FIG. 7 illustrates one exemplary embodiment of a locking mechanism in combination with the spring-loaded clamping mechanism of the invention.

According to the embodiment of the invention as illustrated here and more clearly illustrated in the close-up view of FIG. 7, at least one, and optionally both (shown), of the interior and exterior channel walls 94, 96 are formed with respective opposing notches 134, 136 adjacent to the channel open space 100 near to the first open end 102. The notch or notches 134, 136 are structured to engage mating detents 138, 140 on the locking key 92, whereby the locking key 92 is fixed in locked relationship with the channel 84 portion of the base plate 16. Thereafter, the closed-surface channel 84 and the locking key 92 together operate as a catch for the biasing member or compression spring 106 that spring-loads or "biases" the movable clamp 38 toward the cradle's stationary stop structure 20 in a retractable or expandable manner. For ease of manufacturing the notches 134, 136 are apertures formed completely through the respective channel walls 94, 96 (shown). The notches 134, 136 are optionally closed indentations formed on opposing interior surfaces of the channel walls 94, 96. The detents 138, 140 engage the opposing notches 134, 136 to fix the locking key 92 in locked relationship with the base plate 16 and to capture the compression spring 106 within the channel 84 between the distal foot end 108 of the movable clamp's elongated drive shaft 42 and the first open end 102 of the channel 84 distal from the cradle's stationary stop structure 20.

The locking key 92 is formed of a substantially incompressible material, for example metal or hard plastic, so that the detents 138, 140 are stiff and unyielding. As discussed herein, the closed-surface of channel 84 is formed of a substantially rigid material, such as a metal, rigid plastic or composite material. The interior and exterior walls 94, 96 of the channel 84 are constructed having a width and thickness calculated to cooperate with the locking key 92 such that one or both of the channel walls 94, 96 flex slightly to admit the locking key 92 therebetween when sufficient pressure is applied to force locking key 92 through the opening 102 into the channel open space 100. According to one embodiment of the invention, the detents 138, 140 of the locking key 92 are each formed with a respective lead-in 142, 144 for easing entry of the locking key 92 into the channel open space 100. The lead-ins 142, 144 are, for example, a bevel or chamfer or a fillet (shown). The opening 102 into the channel open space 100 may include lead-ins 146, 148 that further ease entry of the locking key 92.

The locking key 92 includes a body 150 that is shaped to cooperate with the interior of the channel 84 and is sized to fit through the opening 102 into the channel open space 100 and thereafter become fixed in locked relationship with the notches 134, 136 and thereby block the opening 102. For example, the key body 150 is substantially rectangular in cross-section when the channel 84 is formed with a rectangular cross-section. Optionally, the locking key 92 includes an integral tab or "nose" portion 152 that is structured to engage and capture the free end 114 of the biasing spring 106. In order to engage the biasing spring 106, the nose 152 is formed smaller than the key body 150 so that a shoulder 154 is formed at the intersection. The shoulder 154 provides a rest or stop for supporting the biasing spring 106 in a partly compressed state when the biasing spring 106 is a conventional compression spring wound in a tubular shape along its active longitudinal axis, as illustrated. Thus, the nose 152 is sized to fit inside the tubular spring 106, while the shoulder 154 is sized larger than the outer diameter of the tubular biasing spring 106. The nose 152 thereby provides purchase on the locking key body 150 during assembly that helps to maintain the relative positioning and alignment of the biasing spring 106 with the locking key body 150. Optionally, the nose 152 includes means for securing the biasing spring 106 relative to the locking key 92. For example, the nose 152 is formed with a cross-axis dimension, such as a diameter, sized to be a slight interference fit within the tubular coil-type biasing spring 106.

During assembly the key's nose 152 is fitted into the previously free end 114 of the tubular biasing spring 106. The locking key 92 is then pressed through the channel open space 100 and between the walls 94, 96. The key's lead-ins 142, 144 and channel opening lead-ins 146, 148 are used to ease entry of the locking key 92. The channel walls 94, 96 resiliently flex and spread apart to admit the key's detents 138, 140 that extend from the key's body 150. The channel walls 94, 96 continue to flex and spread apart as the key 92 travels along the channel 84. The key's body 150 and nose 152 are further structured to cooperate with the channel walls 94, 96 and the biasing spring 106, respectively, to maintain alignment of the key 92 with the channel 84. When the key 92 is pushed far enough into the channel 84, the key's detents 138, 140 encounter and enter the notches 134, 136 in the channel walls 94, 96. Upon entry of the detents 138, 140 into the cooperating notches 134, 136 the substantially rigid and resiliently flexible interior and exterior channel walls 94, 96 resiliently revert or "snap back" to their natural shape, whereby the key's detents 138, 140 are nested and substantially permanently captured in the cooperating notches 134, 136. The biasing spring 106 is thereby permanently captured within the channel 84 between the distal foot end 108 of the clamp's elongated drive shaft 42 and the first open end 102 of the channel 84 distal from the base's stationary stop structure 20.

According to one embodiment of the invention, the key body 150 optionally includes means for easing ejection from a mold, when the key 92 is manufactured by injection molding plastic, or means for controlling the key 92 during assembly. For example, the key body 150 is hollowed by a aperture 156 therethrough either for a mold ejection pin, or an assembly guide pin or other control device.

FIG. 8 is a perspective view of one embodiment of the locking key 92 wherein the body 150 is embodied as a substantially solid and unbroken block of rigid and unyielding material. The block-shaped body 150 is configured having a thickness X in the area of the shoulder 154 that is sized to be slidingly received between the interior and exterior walls 94, 96 of the channel 84. The bullet-shaped nose 152 projects from the shoulder area 96 and ends in a beveled or rounded (shown) tip 158 that eases engagement with the tubular biasing spring 106. The key's lead-ins 142, 144 gently slope away from the body's shoulder area 96 outward to the form the detents 138, 140. The two detents 138, 140 thus extend outwardly from the body's walls and increase the body's thickness X to greater than the spacing between the walls 94, 96, which permits them to engage and nest in the channel notches 134, 136.

The locking key body 150 is optionally extended beyond the detents 138, 140 distal of the shoulder 154. An extended body area 160 increases the surface contact area between the locking key 92 and the channel walls 94, 96, which reduces or eliminates any tendency for the key body 150 to twist or rotate during or after insertion into the channel 84. The width W of the body 150 is selected in consideration of the attributes of the elongated drive shaft 42 portion of the movable clamp 38 in combination with attributes of the channel 84. The body width W is thus selected to cooperate with the elongated drive shaft 42 and the channel walls 54, 56, which provide spacing between the walls 94, 96, to reduce or eliminate any tendency for the key body 150 to twist or rotate during or after insertion into the channel 84.

FIG. 9 illustrates one exemplary alternative embodiment of the locking key 92 of the invention wherein the body portion 92 is elongated relative to the exemplary embodiment illustrated in FIGS. 3, 4 and 5. Additionally, the detents 138, 140 are spaced-away from the shoulder portion 96, and the aperture 156 is elongated and opened on one end so as to form an open space between a pair of fingers 103a, 103b that contain the detents 138, 140. The extended body area 160 is provided between the shoulder portion 96 and the detents 138, 140 for increasing the surface contact area between the locking key 92 and the channel walls 94, 96 to reduce or eliminate any tendency for the key body 150 to twist or rotate during or after insertion into the channel 84. The exemplary alternative embodiment of the locking key 92 permits the detents 138, 140 to flex inwardly toward one another during assembly with the base plate 16 such that the body 150 of the locking key 92 flexes to fit between the walls 94, 96 of the channel 84, rather than the walls 94, 96 flexing to accommodate the detents 138, 140, as illustrated in previous figures. Upon encountering the notches 134, 136, the fingers 103a, 103b resiliently expand or "snap back" to their natural shape to engage the detents 138, 140 with the notches 134, 136 and nest the detents 138, 140 therein, thereby interlocking the key 92 with the channel 84 for permanently capturing the biasing spring 106 within the channel 84 between the distal foot end 108 of the movable clamp's elongated drive shaft 42 and the first open end 102 of the channel 84 distal from the cradle's stationary stop structure 20.

Figure 10:
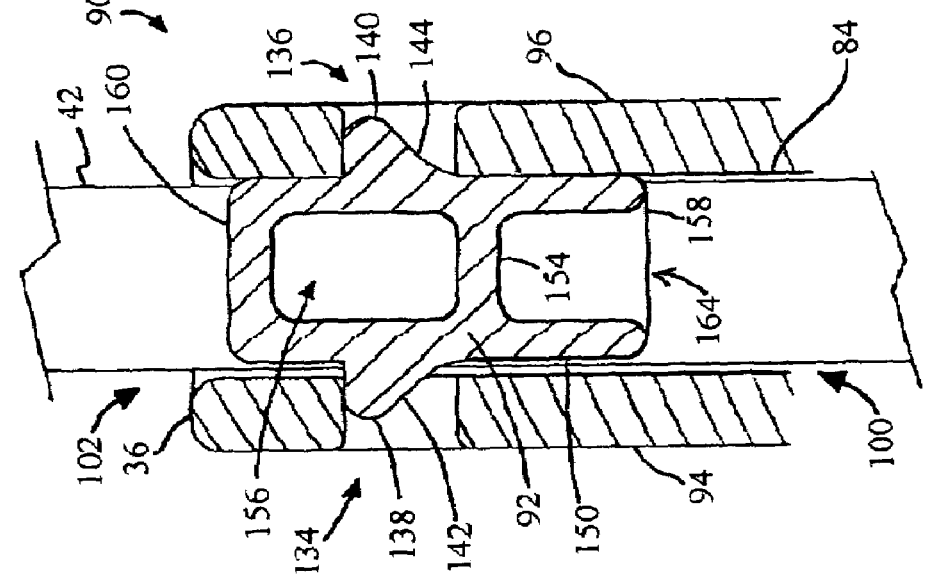

FIG. 10 illustrates one alternative embodiment of the locking mechanism of the invention wherein the locking key 92 is structured to receive the biasing spring 106 into a concave depression or recess. For example, the shoulder portion 154 of the key 92 for supporting the biasing spring 106 in a partly compressed state is formed at the bottom of a depression or recess 164 formed in the surface of the key body 150 in place of the nose portion 152. The recess 164 is sized to accept the tubular shape of the coil-type compression spring 106 and is optionally dimensioned to be a slight interference fit therewith so that the biasing spring 106 is substantially interlocked with the key 92 after assembly into the recess 164.

According to different alternative embodiments of the locking mechanism 90 of the invention, the locking key 92 and channel 84 interlock in a reverse configuration wherein the notches 134, 136 are formed in the walls of the body 150 of the key 92, and the detents 138, 140 are formed as protrusions jutting inwardly of the channel 84 from the opposing interior walls 94, 96 in such manner as to interlock with the notches 134, 136 in the locking key's body 150.

Figure 11:
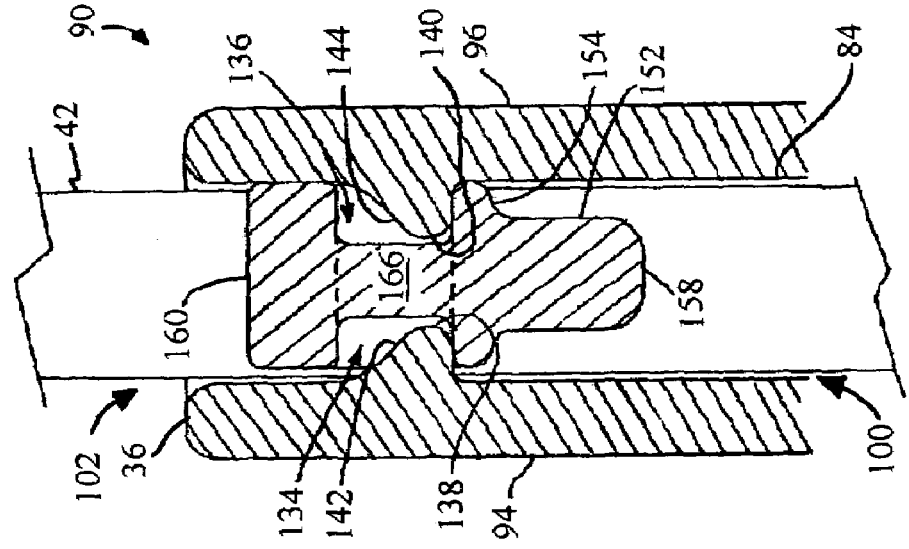

FIG. 11 illustrates one of the alternative embodiments of the locking mechanism 90 wherein the locking key 92 and channel 84 interlock in a reverse configuration. For example, the locking key 92 is formed with either the pair of notches 134, 136 (shown) or an optional single notch 166 (shown in phantom) that is formed as an aperture that passes through the body 150 adjacent to the shoulder 154, and is further formed having the extended body area 160 formed distal of the shoulder 154 past the notch 166 or notches 134, 136 for increasing the surface contact area between the locking key 92 and the channel walls 94, 96, to counteract any tendency for the key body 150 to twist or rotate during or after insertion into the channel 84. The channel walls 94, 96 are formed with the complementary detents 138, 140. The channel walls 94, 96 are designed to flex slightly when forced apart by entry of the locking key 92 therebetween and to resiliently revert or "snap back" to their natural shape, whereby the channel detents 138, 140 are nested and substantially permanently captured in the cooperating notch 166 or notches 134, 136.

Figure 12:
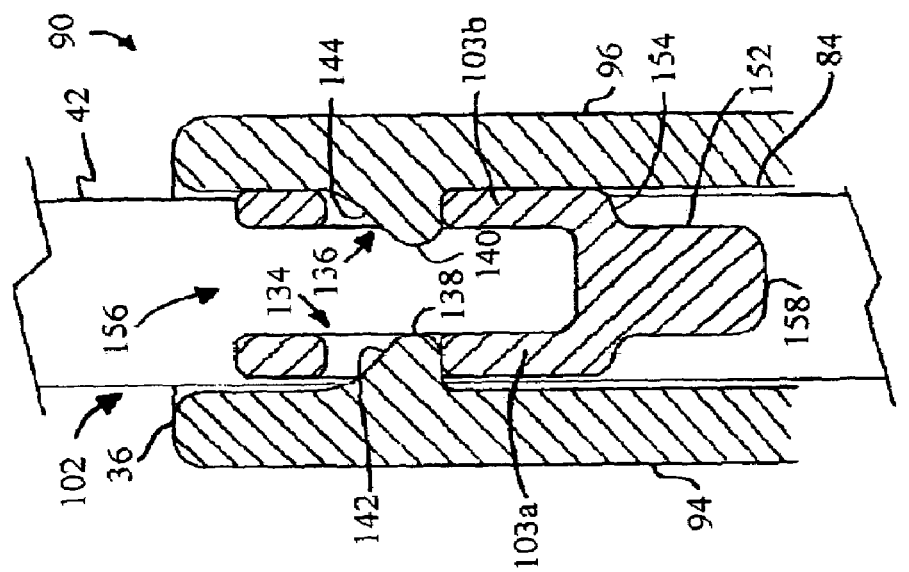

FIG. 12 illustrates one of the alternative embodiments of the locking mechanism 90 wherein the locking key 92 and channel 84 interlock in a reverse configuration. For example, the locking key 92 is formed with the notches 134, 136 spaced-away from the shoulder portion 96, and the aperture 156 is elongated and opened on one end so as to form an open space between the pair of fingers 103a, 103b that contain the notches 134, 136. The exemplary alternative embodiment of the locking key 92 permits the fingers 103a, 103b containing the notches 134, 136 to flex inwardly toward one another during assembly with the base plate 16 such that the body 150 of the locking key 92 flexes to fit between the detents 138, 140 that are formed in the walls 94, 96 of the channel 84, rather than the walls 94, 96 flexing to accommodate the detents 138, 140, as illustrated in previous figures. When the encountering the notches 134, 136, the fingers 103a, 103b resiliently expand or "snap back" to their natural shape to engage the notches 134, 136 with the detents 138, 140 that nest therein, thereby interlocking the key 92 with the channel 84 for permanently capturing the biasing spring 106 within the drive channel 84 between the distal foot end 108 of the movable clamp's elongated drive shaft 42 and the first open end 102 of the drive channel 84 distal from the cradle's stationary stop structure 20.

FIG. 13 illustrates one embodiment of the movable clamp 38 as configured to cooperate with the channel 84 and locking key 92 of the invention. According to one embodiment of the invention, the elongated drive shaft 42 is formed of two spaced-apart elongate rods or shafts 162a, 162b extended crosswise from the rigid bar 35 of the jaw structure 32. The two spaced-apart rods 162a, 162b are joined together at the second foot end 108 of the elongated drive shaft 42 distal from the jaw structure 32. According to one embodiment, the second foot end 108 of the elongated drive shaft 42 is embodied as a bridge member integrally formed between the ends of the two spaced-apart rods 162a, 162b distal from the head end 40 and jaw structure 32.

The biasing spring 106 is selected in width to fit between the spaced-apart rods 162a, 162b and is selected in length to fit between the head end 40 of the movable clamp 38 adjacent to the jaw structure 32 and the foot end 108 embodied as the distal bridge member. The biasing spring 106 is optionally selected having a length that must be slightly compressed to fit between the bar 35 and the foot end 108 of the elongated drive shaft 42.

FIG. 14 illustrates an alternative embodiment of the elongated drive shaft 42 having an elongated L-shaped or J-shaped foot end 108 formed of a single elongated rod 162 with a out-jutting tail formed by the foot end 108 opposite from the jaw structure 32 wherein the tail 108 is structured to secure the end of the biasing spring 106. The tail 108 optionally includes the tab or nib 112 for engaging and capturing the end 110 of the biasing spring 106.

Figure 15:
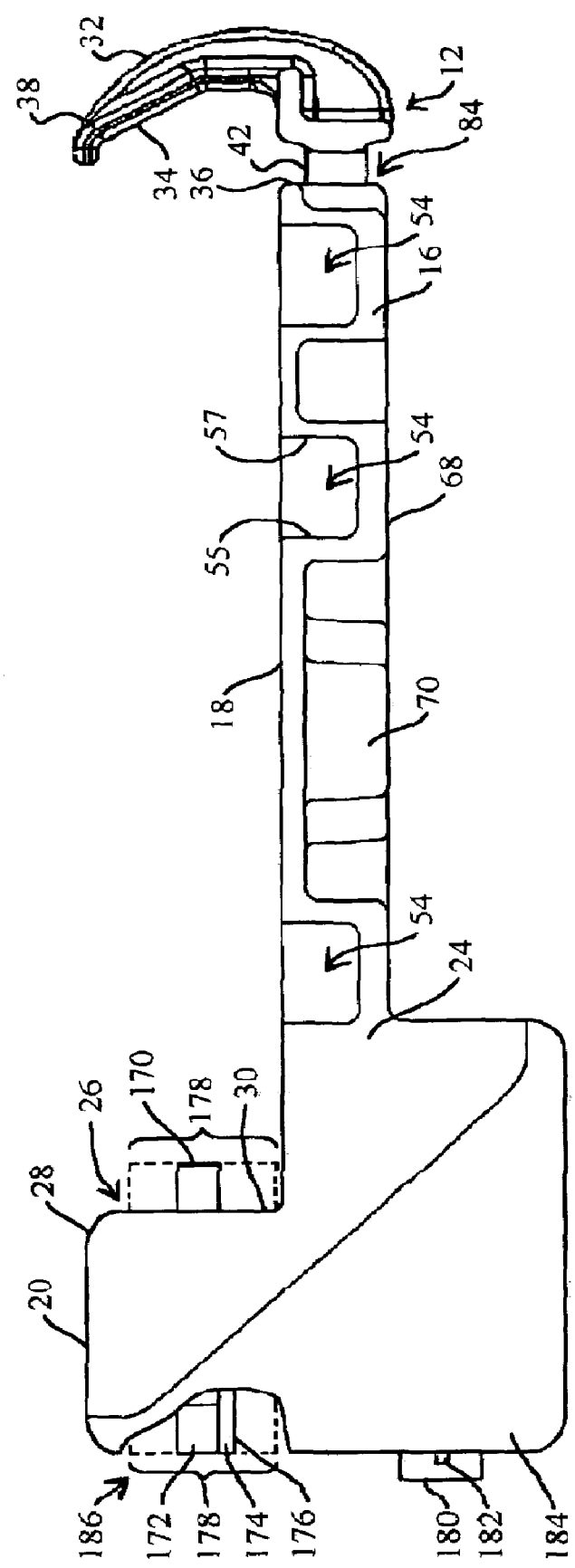
FIGS. 15-19 illustrate an exemplary alternative embodiment of a cradle portion of the releasably-clamped universal mounting apparatus of the present invention.

FIG. 15 illustrates an alternative embodiment of the cradle 14 that is structured to cooperate with the spring-loaded movable clamp 38 and the locking key 92 for securely releasably cradling and electrically interfacing a pocket-sized personal computer or other mobile electronic device in the integral apparatus 10. As illustrated, the base plate 16 of the cradle 14 is substantially the same as illustrated for earlier alternative embodiments, as disclosed herein. The base plate 16 is formed with the substantially planar device mounting surface 18 for receiving a body portion B of the device D. The base plate 16 is also formed with the multiple slots or reliefs 54 spaced apart along its sides 64, 66 for accepting the upright fence posts 44. The integral support interface or connector structure 70 is provided on the back side 68 of the base plate 16 for either permanently or semi-permanently mounting the apparatus 10, as discussed herein. The base plate 16 includes the closed-surface lengthwise drive channel 84 that forms a rigid spine along its back side 68 and houses the drive shaft 42 of the movable clamp 38 portion of the spring-loaded clamping mechanism 12, which is substantially the same as disclosed herein.

As is generally well-known, pocket PCs and other mobile electronic devices D of the type illustrated here, which are intended to be supported by the apparatus 10 of the invention, typically include an electrical input/output I/O interface which is typically located central of the base surface B, as illustrated in FIG. 1. According to one embodiment of the invention, the stop structure 20 is arranged adjacent to the first end 24 of the base plate 16, as discussed herein and projected above the device mounting surface 18

The stop structure 20 includes the first substantially rigid jaw structure 28 having the one or more clamping surfaces 30 that are projected above the base plate 16. However, the clamping surfaces 30 are substantially upright relative to the device mounting surface 18. Furthermore, according to one embodiment of the invention, the clamping surfaces 30 are provided as a single substantially planar surface of the jaw structure 28 against which the base surface B of an inserted device D is compressed by contraction of the spring-loaded clamping mechanism 12.

The stop structure 20 is alternatively structured as a housing for an electrical power and interface input/output (I/O) module (shown in subsequent figures).

The stop structure 20 includes the access passage 26 therethrough and substantially aligned with the first axis 22 of the base plate 16. The clearance passage 26 provides clearance for a first interior electrical input/output interface connector 170 that mates with the input/output I/O port of the inserted device D. A second exterior electrical input/output interface connector 172 accepts a complementary electrical input/output (I/O) cable of a type structured to mates with the input/output I/O port of the inserted device D. The two connectors 170, 172 are mounted on a single printed wiring board (PWB) 174 to form a first electrical circuit 176. Optionally, the two connectors 170, 172 are mapped to one another, either directly or through electrical traces printed on the PWB 174 so that a first electrical circuit 176 acts as a rigid extension cable or card for connecting the inserted device D to an electrical interface I/O cable. Thereafter, the device D can be interfaced with the I/O cable while installed in the cradle 14 of the apparatus 10. Additionally, the I/O cable is optionally permanently attached to the exterior interface connector 172, and the device D is instantly connected upon insertion into the apparatus 10 by coupling the device I/O port into the interior connector 170 in the cradle 14.

In FIG. 15 a portion of the housing-type stop structure 20 is broken away to show the second exterior interface connector 172. According to one embodiment of the invention, both the interior and exterior interface connectors 170, 172 are simultaneously heightwise adjustable relative the device mounting surface 18 within a range 178 (shown in phantom by dashed lines) in a manner described herein by heightwise adjustment of the first electrical circuit 176. The adjustment range 178 extends from about flush with the device mounting surface 18 to near the maximum extents of the housing-type stop structure 20 to accommodate devices D over a wide range of thicknesses T and placements of the I/O port.

In practice, the user permanently adjusts the first electrical circuit 176 heightwise of the device mounting surface 18 to a position within the range 178 that best accommodates the mating I/O port of the inserted device D. Thereafter, the I/O port easily mates with the interior connector 170 when the device D is seated against the device mounting surface 18 during insertion into the apparatus 10 of the invention.

Additional electrical circuitry, including by example and without limitation a computer or other interface connector 180 and electrical power interface connector 182, is optionally provided in the housing-type stop structure 20 in a manner described herein.

When the stop structure 20 is provided as the housing-type structure illustrated here, a housing cover 184 is fastened to the housing-type stop structure 20 to protect the first electrical circuit 176 as well as any additional circuitry that may be provided. The housing cover 184 includes another access passage 186 therethrough that is substantially aligned with the access passage 26 along the first axis 22 of the base plate 16. The access passages 26, 186 of the respective housing-type stop structure 20 and housing cover 184 are sized to accommodate adjustments of the interior and exterior interface connectors 170, 172 within the range 178 in a manner described herein. According to one embodiment of the invention, the interior interface connector 170 extends from the stop structure 20, as illustrated, for insertion into the mating I/O port of the inserted device D that is typically recessed into the base surface B for protection. The exterior interface connector 172 however is recessed into the housing cover 184 for protection.

Figure 16:
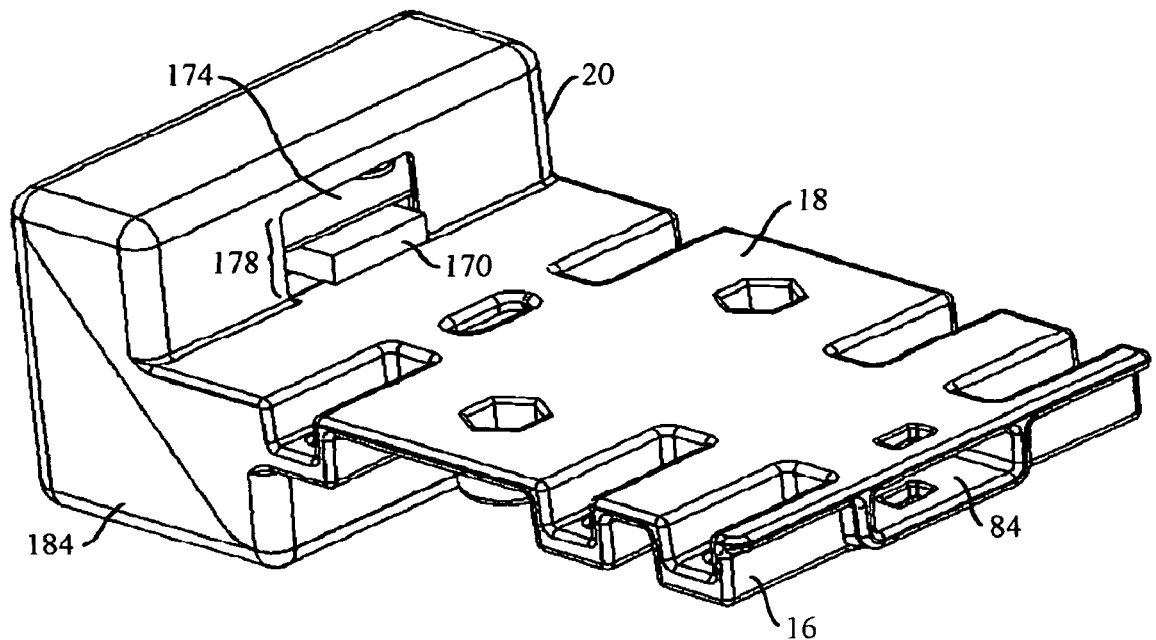

FIG. 16 is a perspective view that illustrates the alternative embodiment of the cradle 14 having the housing-type stop structure 20 and cover 184 with the interior interface connector 170 extended from the PWB 174 through the access passage 26. The interior interface connector 170 is illustrated as being positioned near to the device mounting surface 18 of the base plate 16 for engaging the mating I/O port near the device mounting surface 18. In other words, the interior interface connector 170 is positioned near to the device mounting surface 18 for engaging the mating I/O port of a thin device D, or a thicker device D having its mating I/O port located far down its base surface B and thus near the device mounting surface 18.

Figure 17:
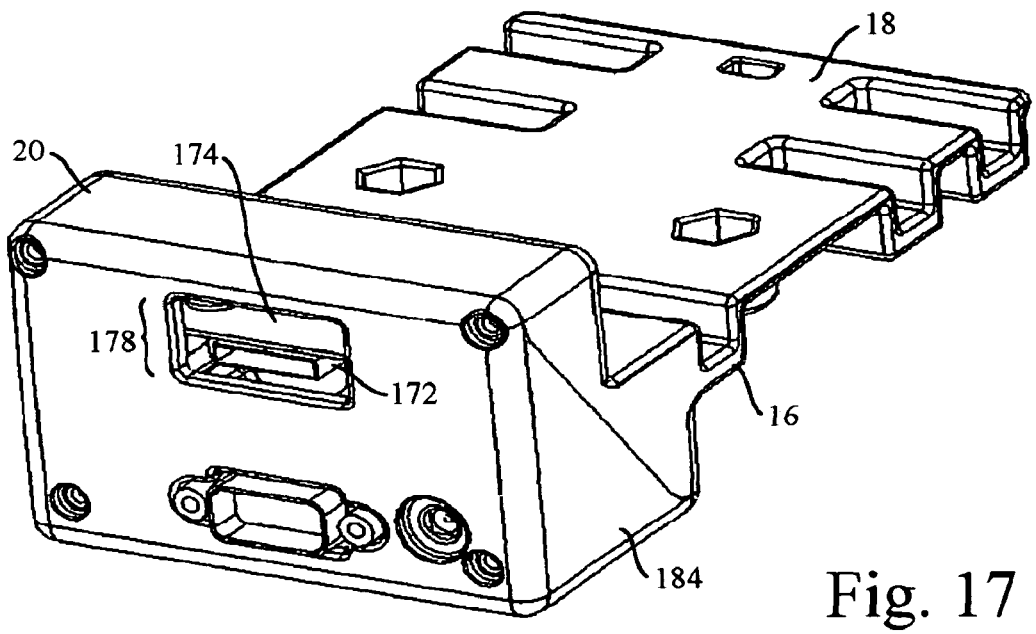

FIG. 17 is another perspective view that illustrates the alternative embodiment of the cradle 14 having the housing-type stop structure 20 and cover 184 with the exterior interface connector 172 exposed on the PWB 174 through the access passage 186 in the housing cover 184. As illustrated, the exterior interface connector 172 is positioned on a level with the interior interface connector 170 relative to the device mounting surface 18. In other words, when the interior and exterior interface connectors 170, 172 are both mounted on the single PWB 174, both interface connectors 170, 172 are similarly positioned within the range 178 relative to the device mounting surface 18.

As illustrated, the exterior interface connector 172 is recessed into the housing cover 184 for protection. However, the access passage 186 in the housing cover 184 provides sufficient clearance around the exterior interface connector 172 to permit mating with an external electrical interface input/output (I/O) cable.

Figure 18:
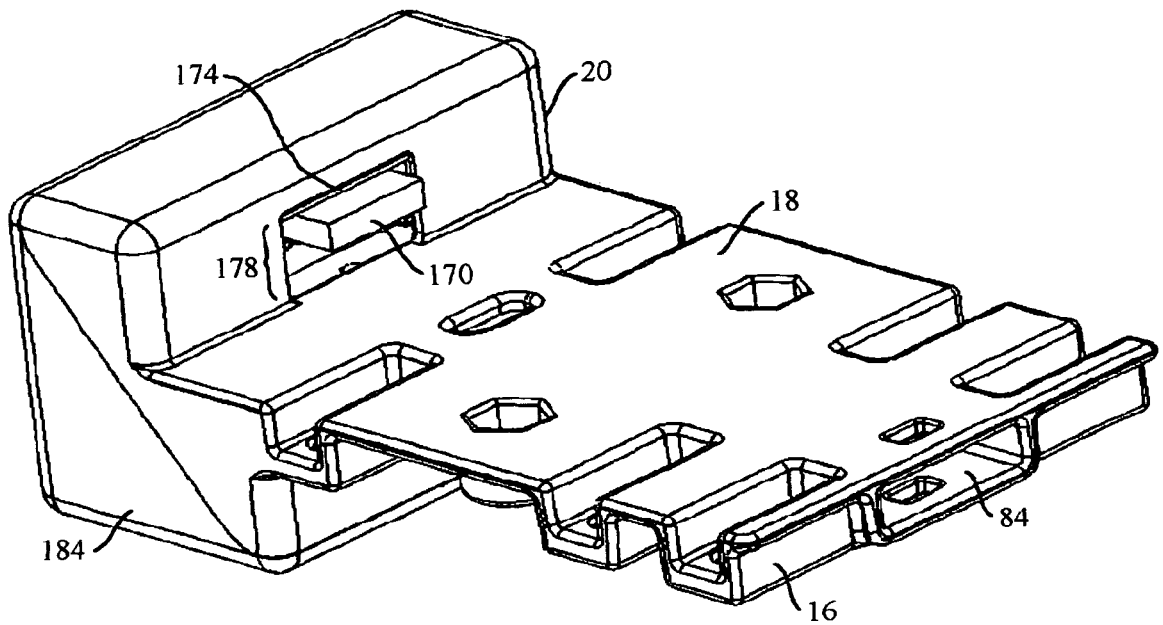

FIG. 18 is a perspective view that illustrates the alternative embodiment of the cradle 14 having the housing-type stop structure 20 and cover 184 with the interior interface connector 170 extended from the PWB 174 through the access passage 26. The interior interface connector 170 is illustrated as being positioned spaced away from the device mounting surface 18 of the base plate 16 for engaging the mating I/O port high above the device mounting surface 18. In other words, the interior interface connector 170 is spaced away from the device mounting surface 18 for engaging the mating I/O port of a thicker device D having its mating I/O port located far up its base surface B and thus spaced away from the device mounting surface 18.

Figure 19:
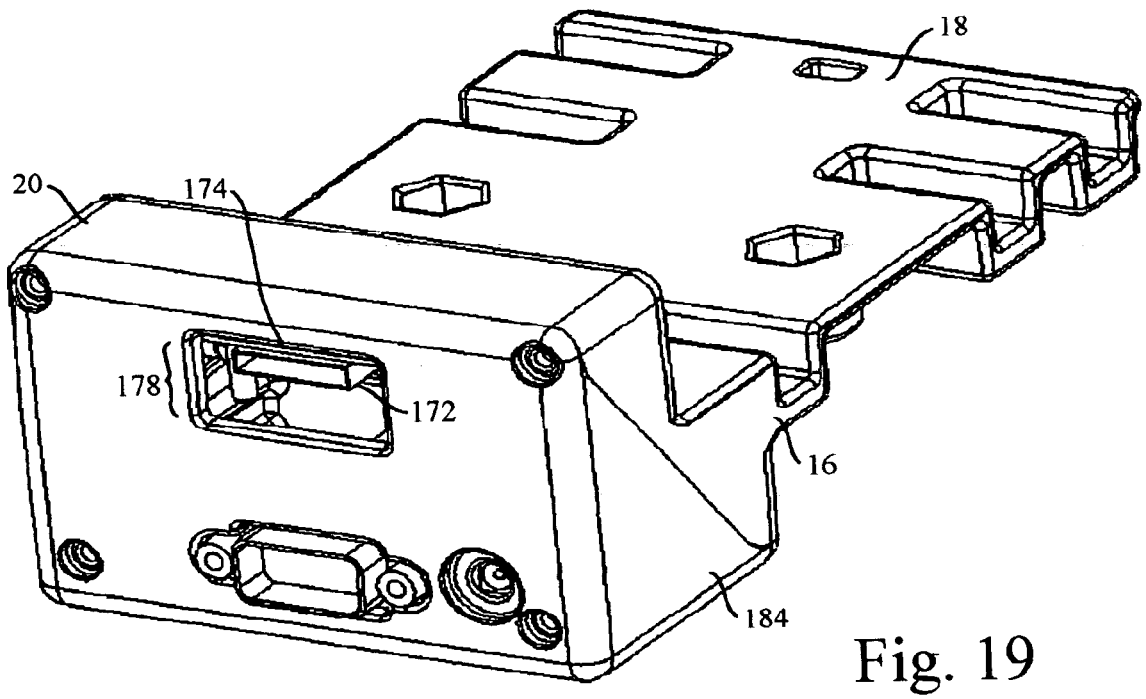

FIG. 19 is another perspective view that illustrates the alternative embodiment of the cradle 14 having the housing-type stop structure 20 and cover 184 with the exterior interface connector 172 exposed on the PWB 174 through the access passage 186 in the housing cover 184. As illustrated, the exterior interface connector 172 is positioned on a level with the interior interface connector 170 relative to the device mounting surface 18. In other words, when the interior and exterior interface connectors 170, 172 are both mounted on the single PWB 174, both interface connectors 170, 172 are similarly positioned within the range 178 relative to the device mounting surface 18.

Figure 20:
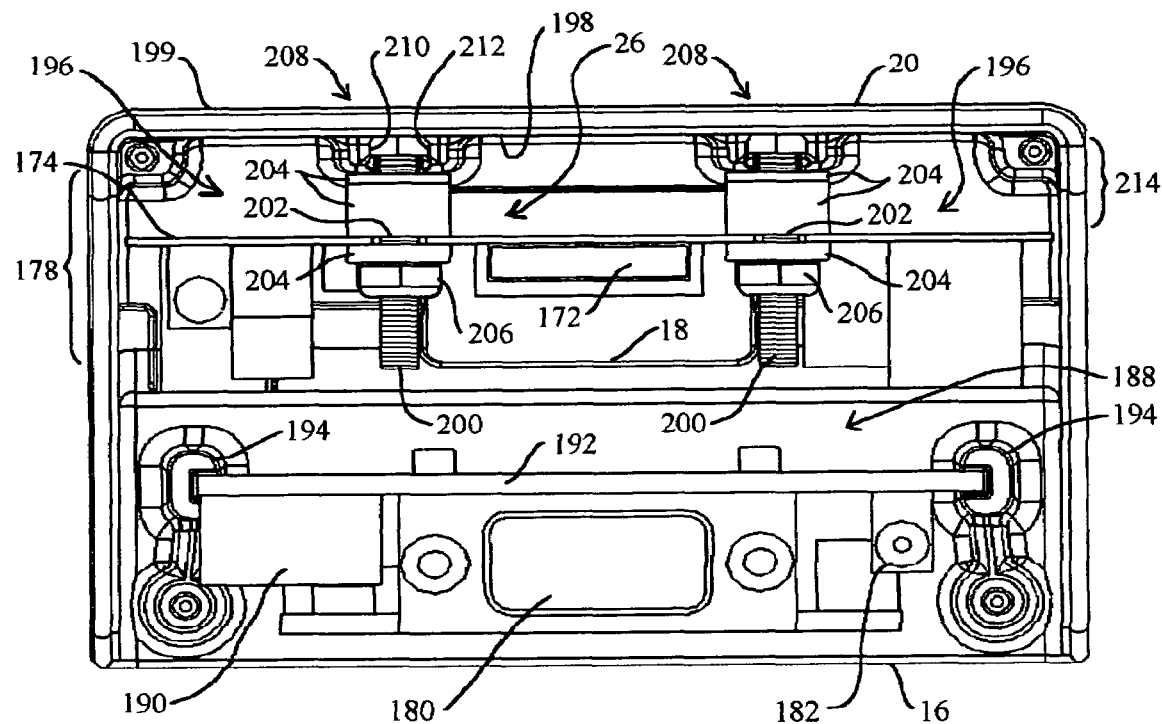
FIGS. 20 and 21 illustrate an exemplary embodiment of an adjustable height spacer structure of the present invention.

FIG. 20 is an end view into an electronics module chamber 188 that is substantially enclosed between the housing-type stop structure 20 of the cradle and its cover 184.

As illustrated here by example and without limitation, the additional electrical circuitry, including the computer or other interface connector 180, electrical power interface connector 182, and supporting circuitry 190, including by example and without limitation the computer or other interface connector 180 and electrical power interface connector 182, is optionally provided on one or more additional PWBs 192 separate from the PWB 174 having the interior and exterior interface connectors 170, 172. The second PWB 192 is mounted, by example and without limitation, in a stationary PWB slot structure 194 built inside the housing-type stop structure 20. Optionally, alternative or additional stationary PWB slot structure is built inside the housing cover 184.

In contrast, the PWB 174 having the interior and exterior interface connectors 170, 172 is mounted on adjustable height spacer structure 196 that permits the PWB 174 and consequently the interior and exterior interface connectors 170, 172 to different permanent elevations relative to the device mounting surface 18 of the base plate 16. According to one embodiment of the invention, the adjustable height spacer structure 196 is arranged relative to an inner ceiling surface 198 of the module chamber 188. The inner ceiling surface 198 of the module chamber 188 is a ceiling part 199 of the stationary housing-type stop structure 20 and is thus fixed in relationship to the device mounting surface 18 of the base plate 16. Therefore, height adjustment relative to the ceiling 198 of the module chamber 188 is exactly opposite to height adjustment relative to the device mounting surface 18 of the base plate 16. In other words, adjustment of the PWB 174 away from the ceiling 198 of the module chamber 188 is adjustment toward the device mounting surface 18 of the base plate 16; and adjustment of the PWB 174 toward the ceiling 198 of the module chamber 188 is adjustment away from the device mounting surface 18 of the base plate 16.

According to the embodiment of the invention illustrated here by example and without limitation, the adjustable height spacer structure 196 of the invention includes a pair of threaded fasteners 200 through clearance apertures 202, either holes or notches (shown), through the PWB 174 with one or more spacers 204 on either side of the PWB 174 and a pair of threaded nuts 206 securing the PWB 174.

The adjustable height spacer structure 196 of the invention also includes fastener containment structures 208, either holes through the ceiling part 199 of the stop structure 20 or slot structures (shown), for each of the threaded fasteners 200. When the fastener containment structures 208 are slot structures as shown, the slot-type fastener containment structures 208 are each formed with substantially parallel spaced-apart wall surfaces 210, 212 that optionally operate to constrain the fasteners 200 from turning when they are square or hex head screws used in combination with the threaded nuts 206, as illustrated.

The two interface connectors 170, 172 are arranged in different height adjustments with the ceiling part 199 of the stop structure 20 by varying the number and thickness of the one or more spacers 208 between the ceiling 198 of the module chamber 188 and the PWB 174. More or thicker spacers 208 move the PWB 174 further from the ceiling surface 198 of the module chamber 188 and closer to the device mounting surface 18 of the base plate 16; fewer or thinner spacers 208 move the PWB 174 closer to the ceiling surface 198 of the module chamber 188 and further from the device mounting surface 18. One or more additional spacers 210 on the opposite side of the PWB 174 from the ceiling 198 of the module chamber 188 may help to stabilize the PWB 174 when the nuts 206 are installed, as illustrated.

According to one embodiment of the invention, the spacers 204 are of varying thicknesses, as illustrated, so that different combinations result in different offset distances 214 from the ceiling surface 198 of the module chamber 188 toward the device mounting surface 18 of the base plate 16. The spacers 208 thus provide height adjustments of the PWB 174 and the two interface connectors 170, 172 within the range 178 relative to the device mounting surface 18, as discussed herein.

According to different embodiments of the invention, the spacers 204 are either ring or washer-type spacers or horse shoe shaped spacers that can be removed and reinstalled with the nuts 206 loosened but in place.

Figure 21:
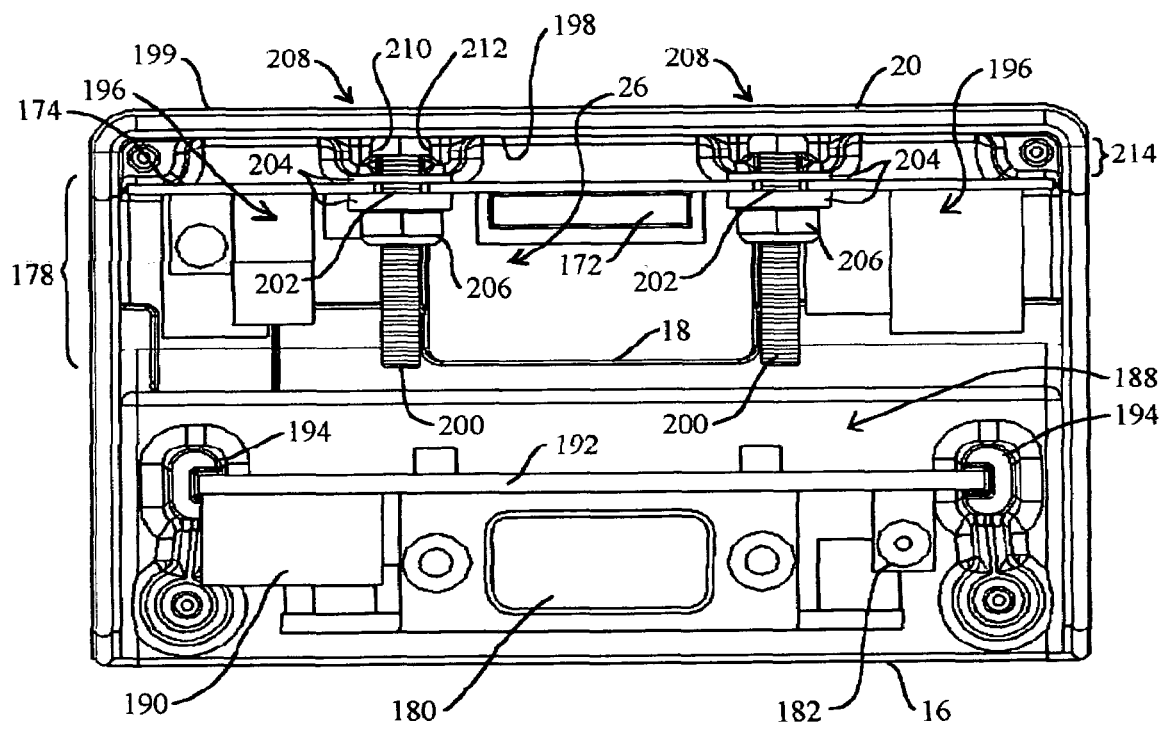

FIG. 21 is another end view into an electronics module chamber 188 that shows a different number of the spacers 208 of different thickness between the PWB 174 and the ceiling surface 198 of the module chamber 188, whereby the PWB 174 and the two interface connectors 170, 172 are adjusted to a different offset distance 214 relative to the ceiling surface 198 of the module chamber 188. Accordingly, the PWB 174 and the two interface connectors 170, 172 are adjusted to a different position within the range 178 relative to the device mounting surface 18, as discussed herein.

Different devices D have different mating I/O port so that the invention envisions and anticipates different PWBs 174 having different interior and exterior interface connectors 170, 172 that are adapted for use with the different devices D. The additional supporting circuitry 190, including by example and without limitation the computer or other interface connector 180 and electrical power interface connector 182, may be different as well for different devices D. Accordingly, both the PWB 174 and the one or more additional PWBs 192 having the supporting circuitry 190 are easily changed-out. The PWB 174 is changed-out by removal of the pair of threaded nuts 206 securing the PWB 174 in the housing 20, replacing the PWB 174 at the desired offset distance 214, and reinstalling the threaded nuts 206 on the threaded fasteners 200. The additional PWBs 192 having the supporting circuitry 190 are changed-out by removal from the PWB slot structure 194 in the housing-type stop structure 20 and installation of one or more PWBs 192.

Figure 22:
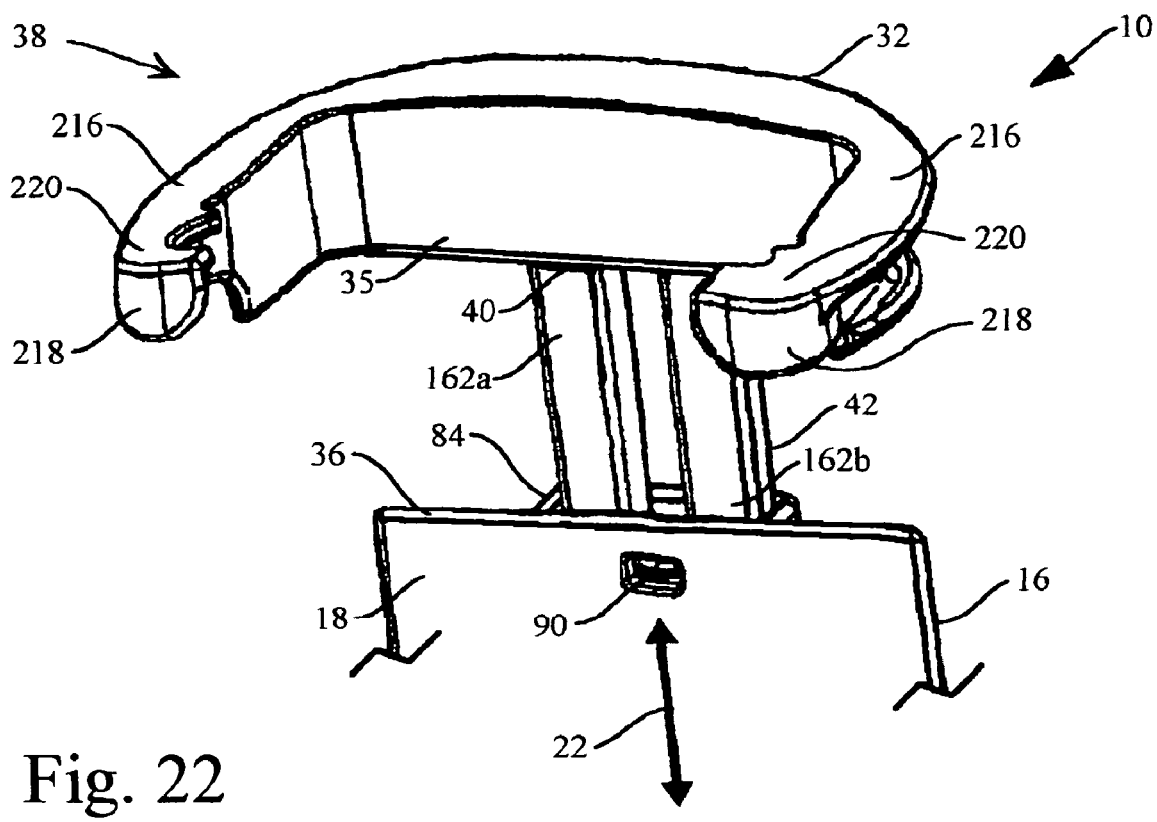
FIGS. 22 and 23 illustrate another alternative embodiment of the movable clamp portion of the spring-loaded clamping mechanism of the invention.

FIG. 22 illustrates another alternative embodiment of the movable clamp 38 of the spring-loaded or otherwise resiliently biased clamping mechanism 12 of the invention. The movable clamp structure 38 is modified in accordance with the corresponding clamp structure disclosed in co-pending U.S. patent application Ser. No. 10/636,058, which is incorporated herein by reference. Accordingly, the jaw structure 32 is formed on the substantially rigid bar 35 coupled adjacent to the head end 40 of the substantially rigid drive shaft 42. The jaw structure 32 is modified such that the jaw structure 32 forms a pair of "wings" 216 that are structured for positively engaging the superior shoulder portions S1 of an inserted device D.

As illustrated herein, the pair of winged jaw structures 216 are projected above the base plate 16 and spaced apart across the first axis 22 of the base plate 16. The winged jaw structures 216 are contoured to positively engage the superior shoulder portions S1 of an inserted device D. Furthermore, the winged jaw structures 216 include epaulets 218 that are contoured to encompass opposing superior shoulder portions S1 of an inserted device D, while exposing the facial display screen DS of the installed device D for easy viewing by the user. The two epaulets 218 include end caps 220 having the substantially planar clamping surfaces 34 formed on inner surfaces thereof (shown in FIG. 23).

In operation, the device D is loaded into the apparatus 10 of the invention by first retracting the movable clamp structure 38 relative to the base plate 16 against the compressed spring pressure of the compression spring 106. When the movable clamp structure 38 is sufficiently expanded relative to the base plate 16, the device D is seated against the device mounting surface 18 of the base plate 16 between the fence posts 44 and bottomed against the stop structure 20. The device D is electrically interfaced by means of mating the input/output I/O port in the base surface B of the device D with a complementary external electrical interface input/output (I/O) cable.

When the stop structure 20 is provided as the housing-type structure having the PWBs 174 with the interior and exterior interface connectors 170, 172 thereon, the input/output I/O port in the base surface B of the device D is coupled to the interior interface connector 170 while being bottomed against the stop structure 20. Pre-positioning the fence posts 44 as a function of the width of the device D to be inserted thereafter enables the fence posts 44 to guide the input/output I/O port to the interior interface connector 170 for easy connection.

Figure 23:
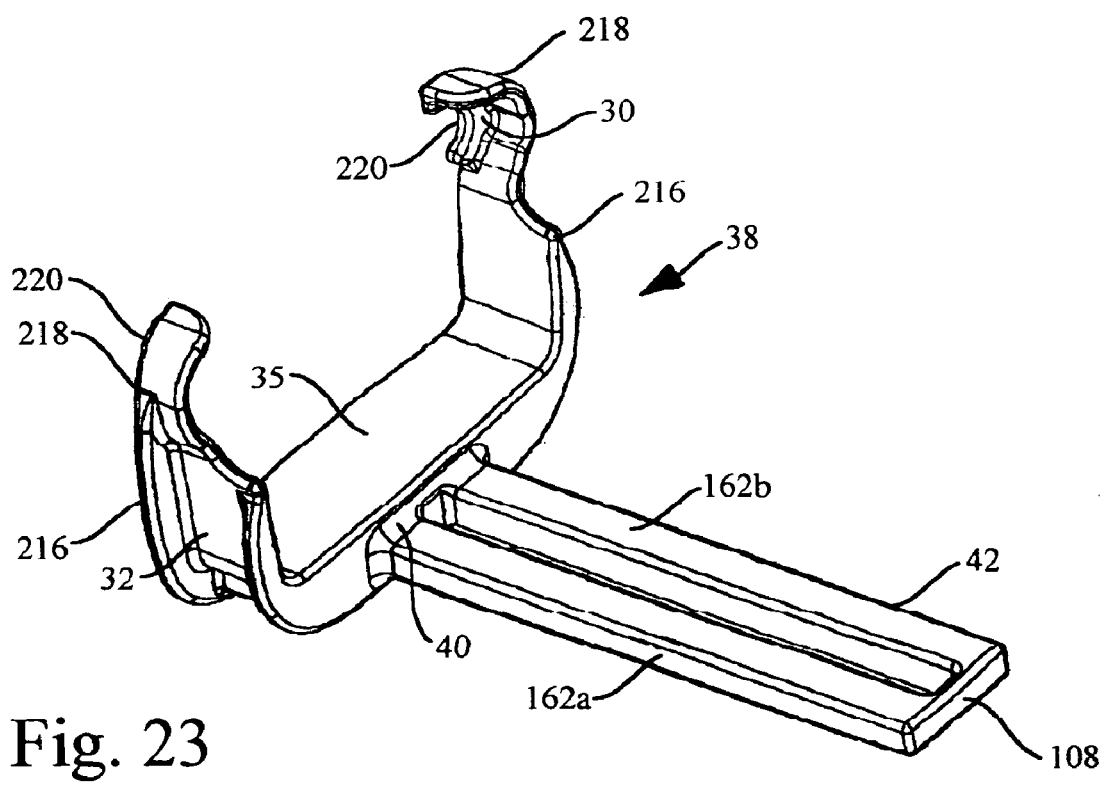

FIG. 23 illustrates the alternative movable clamp 38 as configured to cooperate with the channel 84 and locking key 92 of the invention. As illustrated, the elongated drive shaft 42 is formed of the two spaced-apart elongate rods or shafts 162a, 162b extended crosswise from the rigid bar 35 of the jaw structure 32. The two spaced-apart rods 162a, 162b are joined together at the second foot end 108 of the elongated drive shaft 42 distal from the jaw structure 32. According to one embodiment, the second foot end 108 of the elongated drive shaft 42 is embodied as a bridge member integrally formed between the ends of the two spaced-apart rods 162a, 162b distal from the head end 40 and jaw structure 32.

The biasing spring 106 is selected in width to fit between the spaced-apart rods 162a, 162b and is selected in length to fit between the head end 40 of the movable clamp 38 adjacent to the jaw structure 32 and the foot end 108 embodied as the distal bridge member. The biasing spring 106 is optionally selected having a length that must be slightly compressed to fit between the bar 35 and the foot end 108 of the elongated drive shaft 42.

While the preferred embodiment of the invention has been illustrated and described, it will be appreciated that various changes can be made therein without departing from the spirit and scope of the invention. Therefore, the inventor makes the following claims.

What is claimed is:

1. A universal mounting apparatus for a mobile electronics device, the apparatus comprising:
a substantially rigid cradle comprising a base plate and a stop structure arranged along a first operational axis of the base plate, the stop structure including one or more relatively stationary clamping surfaces that are projected above a device mounting surface of the base plate and substantially transverse thereof and includes clearance therethrough that is substantially aligned with the first operational axis of the base plate;
a linearly expandable clamping mechanism comprising:
two spaced apart surfaces formed in the base plate of the rigid cradle along the first operational axis thereof,
a movable clamp structure that is arranged for substantially linear elastic motion substantially along the first operational axis of the base plate of the rigid cradle, the movable clamp structure comprising one or more movable clamping surfaces that are projected above and angularly inclined toward the device mounting surface of the base plate, and further comprising a drive portion that is structured to be slidingly engaged between the two spaced apart surfaces,
an elastic biasing member comprising a resiliently compressible biasing member positioned between the two spaced apart surfaces, the elastic biasing member being coupled between the movable clamp structure and the base plate of the rigid cradle for elastically biasing the one or more movable clamping surfaces toward the stationary clamping surfaces in a substantially linear elastic motion substantially along the first operational axis of the base plate,
a locking key engaging the biasing member between the drive portion and at least one of the spaced apart surfaces, the locking key interlocked with at least one of the two spaced apart surfaces, and
one of the locking key and one of the spaced apart surfaces resiliently flexes to permit the locking key to be positioned between the two spaced apart surfaces and further relaxes for interlocking the locking key between the two spaced apart surfaces after the locking key is positioned; and
a plurality of substantially upright posts arranged between the one or more movable and stationary clamping surfaces, one or more of the posts being repositionable laterally of the first operational axis.

2. The apparatus of claim 1 wherein the cradle further comprises mechanical connector structure formed thereon for mounting to an external support structure.

3. The apparatus of claim 1 wherein the one or more movable clamping surfaces of the movable clamp structure form angles in the range of about 60 degrees to 90 degrees with the device mounting surface of the base plate.

4. The apparatus of claim 3 wherein the one or more stationary clamping surfaces of the stop structure are further angularly inclined toward the device mounting surface of the base plate.

5. The apparatus of claim 4 wherein the stop structure further comprises a plurality of the one or more stationary clamping surfaces spaced apart across the first axis of base plate and having the clearance formed therebetween.

6. The apparatus of claim 1 wherein the stop structure further comprises a housing structure projected above a device mounting surface of the base plate, the housing structure having the one or more relatively stationary clamping surfaces formed thereon with the clearance formed therethrough.

7. The apparatus of claim 6 wherein the one or more relatively stationary clamping surfaces formed on the housing structure are arranged substantially upright relative to the device mounting surface of the base plate.

8. The apparatus of claim 7, further comprising:
a printed wiring board having an electrical input/output interface connector mounted thereon; and
an adjustable height spacer structure arranged for securing the printed wiring board within the housing structure with the electrical input/output interface connector projected along the first axis of the base plate and inward of the one or more relatively stationary clamping surfaces through the clearance, the adjustable height spacer structure being structured for adjusting a position of the printed wiring board within the housing structure relative to the device mounting surface of the base plate.

9. A universal mounting apparatus for a mobile electronics device, the apparatus comprising:
a substantially rigid device cradle comprising a base plate having a substantially planar device mounting surface with an integral stop structure adjacent to a first end thereof and projected thereabove, and an integral linear drive channel arranged along a first axis thereof, the linear drive channel further comprising two spaced apart surfaces formed in the base plate of the cradle along the first axis thereof;
a linear clamping mechanism comprising:

a substantially rigid linear drive shaft slidingly engaging the linear drive channel of the rigid cradle with a movable clamp structure projected above the device mounting surface of the base plate adjacent to a second end thereof, the movable clamp structure comprising one or more clamping surfaces angularly inclined toward the device mounting surface of the base plate and toward the integral stop structure projected thereabove, and further comprising a drive portion that is structured to be slidingly engaged between the two spaced apart surfaces, a spring positioned between the two spaced apart surfaces and being coupled for biasing the movable clamp structure toward the integral stop structure of the base plate along the first axis thereof, a locking key engaging the spring between the drive portion and at least one of the spaced apart surfaces, the locking key interlocked with at least one of the two spaced apart surfaces, and one of the locking key and one of the spaced apart surfaces being resiliently flexible for receiving the locking key in a position between the two spaced apart surfaces and interlocking the locking key therewith; and a plurality of substantially upright posts coupled to the base plate spaced apart on opposite sides of the first axis thereof between the first and second end thereof.

10. The apparatus of claim 9 wherein one or more of the plurality of upright posts is further adjustable relative to the first axis of the base plate.

11. The apparatus of claim 10 wherein one or more of the plurality of upright posts is further repositionable along the first axis of the base plate.

12. The apparatus of claim 9 wherein one or more of the angularly inclined clamping surfaces form an angle in the range of about 45 degrees to about 75 degrees with the device mounting surface of the base plate.

13. The apparatus of claim 9 wherein the integral stop structure further comprises one or more clamping surfaces angularly inclined toward the device mounting surface of the base plate and toward the second end of the base plate.

14. The apparatus of claim 9 wherein the device cradle further comprises an integral housing structure formed with the integral stop structure adjacent to the first end of the device mounting surface and projected thereabove, the housing structure further comprising a ceiling surface spaced away from the device mounting surface of the base plate; and further comprising:

a printed wiring board having an electrical input/output interface connector mounted thereon; and an adjustable height spacer structure arranged for securing the printed wiring board within the housing structure in an adjustable offset position relative to the ceiling surface thereof with the electrical input/output interface connector substantially aligned along the first axis of the base plate and projected toward the second end of the base plate.

15. A universal mounting apparatus for a mobile electronics device, the apparatus comprising:

a substantially rigid base plate having a substantially planar device mounting surface and an integral linear drive channel extended along a first axis of the base plate, the linear drive channel further comprising two spaced apart surfaces formed in the base plate substantially along the first axis thereof;

a substantially rigid housing structure integrally formed adjacent one end of the base plate, one surface of the housing being formed with one or more substantially planar clamping surfaces projected above the device mounting surface and a clearance passage positioned above the device mounting surface and substantially aligned with the first axis of the base plate;

a printed wiring board having an interior interface connector and an exterior interface connector mounted thereon;

an adjustable height spacer structure adjustably fixedly positioning the printed wiring board within the housing with the interior interface connector projected through the clearance passage above the device mounting surface and substantially aligned with the first axis of the base plate, the adjustable height spacer structure further comprising one or more different spacers positioned between the printed wiring board and an inner surface of the housing;

a plurality of substantially upright fence posts arranged along the first axis of the base plate on opposite sides of the device mounting surface; and a spring-loaded clamping mechanism coupled to the base plate, the clamping mechanism comprising:

a movable clamp structure formed of a substantially rigid drive shaft that is structured to slide linearly between the two spaced apart surfaces of the drive channel relative to the device mounting surface of the base plate, and a clamp structure formed adjacent to a head end of the drive shaft and having an integral jaw structure projected above the drive shaft, and a spring constrained between the two spaced apart surfaces of the drive channel and being coupled between the drive shaft and the drive channel for urging the clamp structure toward the clamping surfaces of the rigid housing structure, a locking key engaging the spring between the drive shaft and at least one of the spaced apart surfaces, the locking key interlocked with at least one of the two spaced apart surfaces, and one of the locking key and one of the spaced apart surfaces flexibly receiving the locking key between the two spaced apart surfaces and further for interlocking the locking key between the two spaced apart surfaces.

16. The apparatus of claim 15 wherein the fence posts are further adjustable relative to the first axis of the base plate.

17. The apparatus of claim 15 wherein the integral jaw structure of the movable clamp structure further comprises a plurality of clamping surfaces projected above the drive shaft and inclined theretoward.

18. The apparatus of claim 17 wherein one or more of the plurality of inclined clamping surfaces form an angle in the range of about 45 degrees to about 75 degrees with the drive shaft.

* * * * *